(12) United States Patent
Nishiyama

(10) Patent No.: US 7,372,672 B2
(45) Date of Patent: May 13, 2008

(54) GMR MAGNETIC SENSING ELEMENT HAVING AN ANTIFERROMAGNETIC LAYER EXTENDING BEYOND THE TRACK WIDTH AND METHOD FOR MAKING THE SAME

(75) Inventor: Yoshihiro Nishiyama, Niigata-ken (JP)

(73) Assignee: TDK Corporation, Tokyo (JP)

( * ) Notice: Subject to any disclaimer, the term of this patent is extended or adjusted under 35 U.S.C. 154(b) by 256 days.

(21) Appl. No.: 11/270,087

(22) Filed: Nov. 8, 2005

(65) Prior Publication Data

US 2007/0252588 A1    Nov. 1, 2007

Related U.S. Application Data

(62) Division of application No. 10/461,809, filed on Jun. 13, 2003, now Pat. No. 7,050,276.

(30) Foreign Application Priority Data

Jun. 13, 2002    (JP) .............................. 2002-172147

(51) Int. Cl.
*G11B 5/39* (2006.01)
(52) U.S. Cl. ............................................. 360/324.11
(58) Field of Classification Search ........... 360/324.11, 360/324.12, 324.1, 324.2
See application file for complete search history.

(56) References Cited

U.S. PATENT DOCUMENTS

| | | | |
|---|---|---|---|
| 6,103,136 A * | 8/2000 | Han et al. ..................... 216/22 |
| 6,222,707 B1 | 4/2001 | Huai et al. |
| 6,259,586 B1 | 7/2001 | Gill |
| 6,456,469 B1 | 9/2002 | Gill |
| 6,466,419 B1 | 10/2002 | Mao |
| 6,700,760 B1 | 3/2004 | Mao |
| 6,704,175 B2 | 3/2004 | Li et al. |
| 6,791,805 B2 | 9/2004 | Heinonen et al. |
| 6,795,280 B1 | 9/2004 | Song et al. |
| 7,193,821 B2* | 3/2007 | Miyauchi .................. 360/324.1 |
| 2003/0039080 A1* | 2/2003 | Kagami et al. .......... 360/324.1 |

FOREIGN PATENT DOCUMENTS

| | | |
|---|---|---|
| JP | 10-124823 | 5/1998 |
| JP | 2000-293822 | 10/2000 |

\* cited by examiner

*Primary Examiner*—Angel Castro
(74) *Attorney, Agent, or Firm*—Brinks Hofer Gilson & Lione

(57) ABSTRACT

A magnetic sensing element with improved magnetic detection output and a method for making the same are provided. In the magnetic sensing element, the length of an upper pinned magnetic layer an upper antiferromagnetic layer in a track width direction is larger than the length of a free magnetic layer in the track width direction. In making the magnetic sensing element, there is no need to remove side portions of the upper pinned magnetic layer and the upper antiferromagnetic layer. The materials of the upper pinned magnetic layer and the upper antiferromagnetic layer are thus prevented from redepositing on two side faces of the free magnetic layer during milling.

5 Claims, 21 Drawing Sheets

FIG. 4
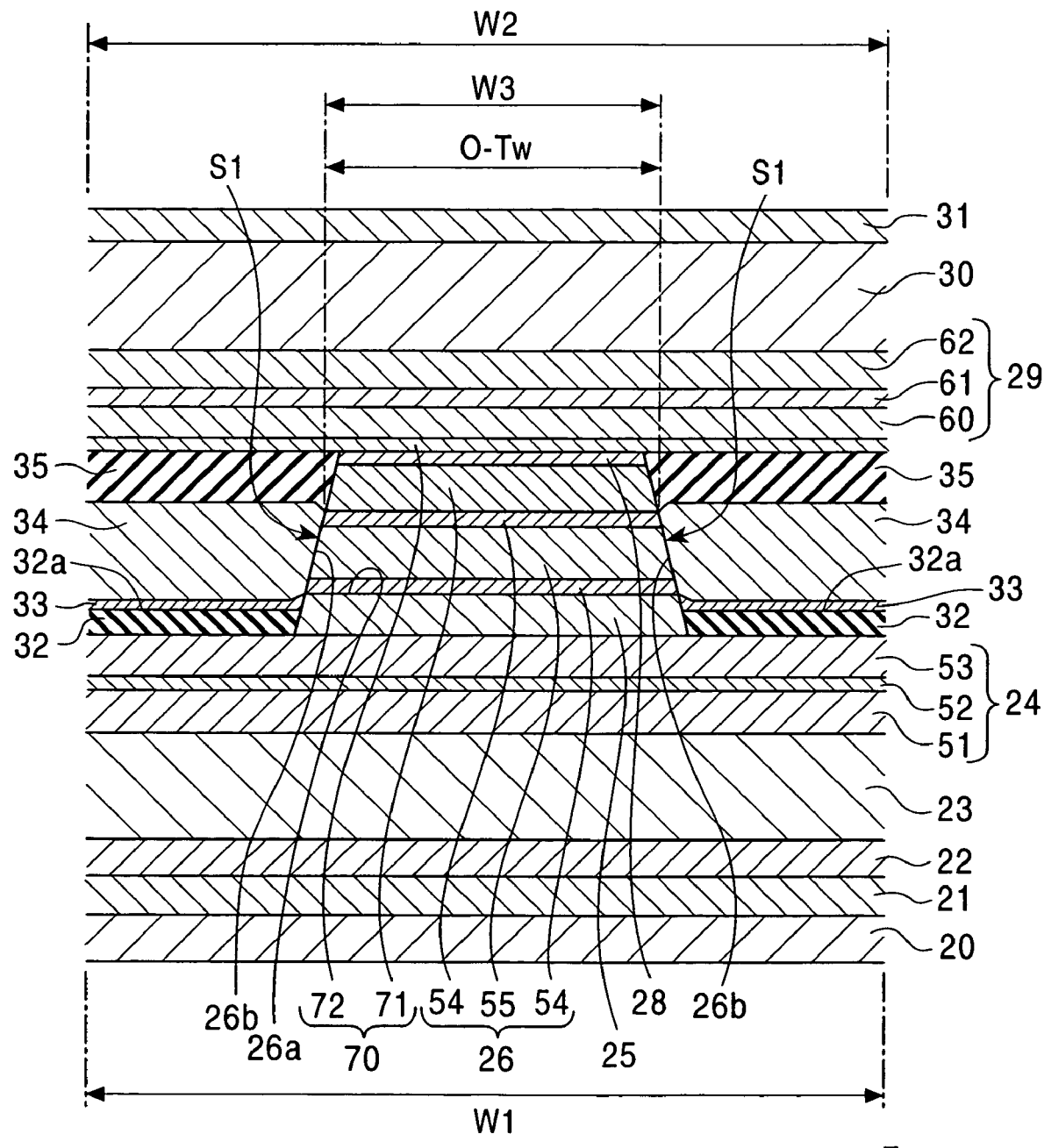
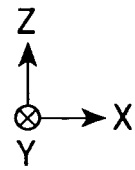

FIG. 26
PRIOR ART
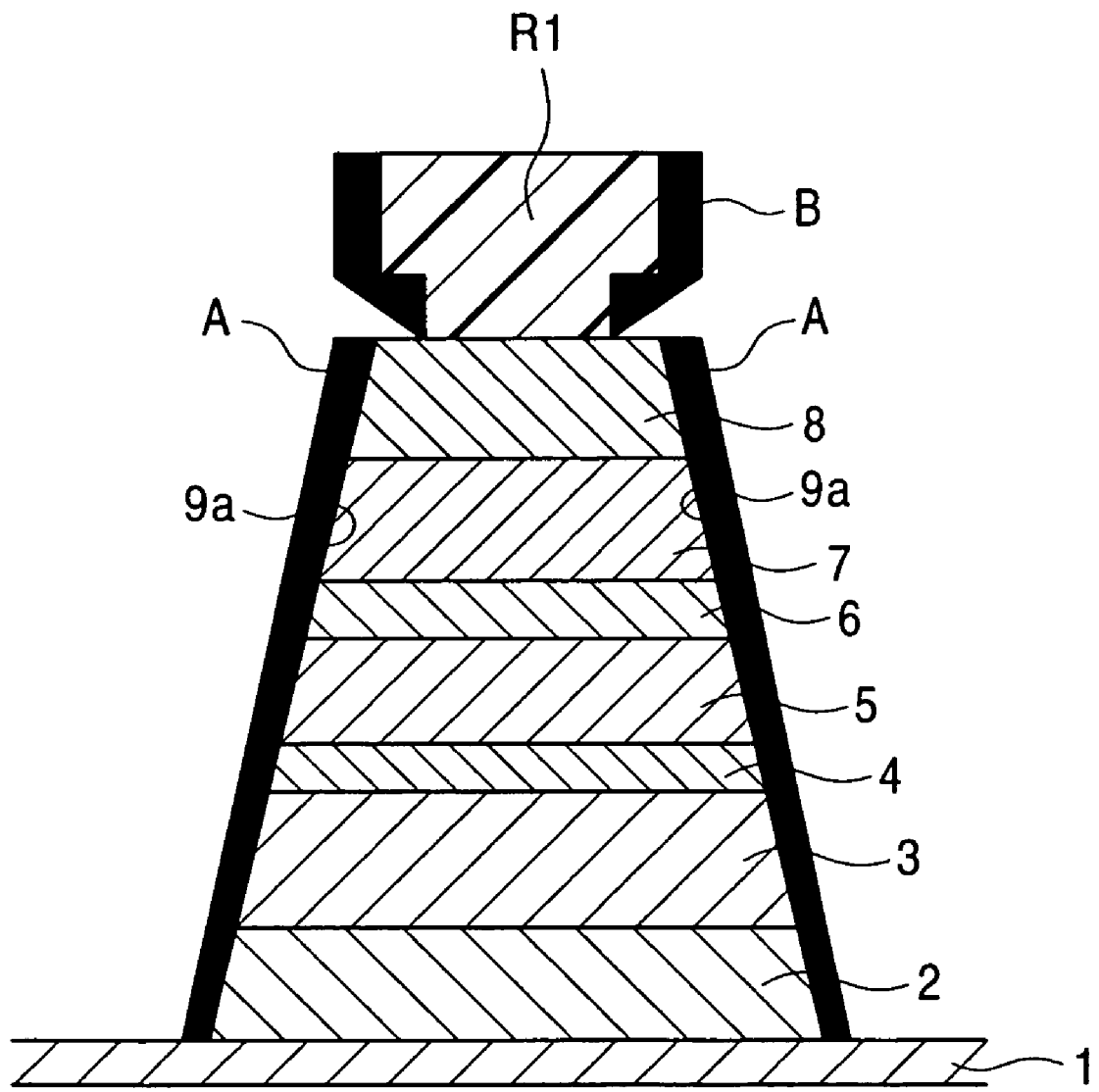
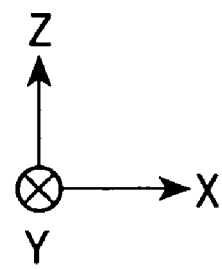

GMR MAGNETIC SENSING ELEMENT HAVING AN ANTIFERROMAGNETIC LAYER EXTENDING BEYOND THE TRACK WIDTH AND METHOD FOR MAKING THE SAME

This application is a divisional of application Ser. No.: 10,461,809, filed on Jun. 13, 2003, now U.S. Pat. No. 7,050,276 which claims the benefit of Japanese Patent Application 2002-172147, filed on Jun. 13, 2002, both of which are incorporated herein by reference.

BACKGROUND OF THE INVENTION

1. Field of the Invention

The present invention generally relates to magnetic sensing elements for use in magnetic sensors and hard disks and methods for making the same. In particular, it relates to a magnetic sensing element that can be readily used with narrower tracks and that has improved sensitivity to magnetic fields, and to a method for making the same.

2. Description of the Related Art

FIG. 24 is a cross-sectional view of a conventional spin-valve magnetic sensing element viewed from a face that opposes a recording medium. Hereinafter, this face is referred to as the "opposing face".

The magnetic sensing element includes a composite film 9 constituted from an antiferromagnetic layer 2, a pinned magnetic layer 3, a nonmagnetic material layer 4, a free magnetic layer 5, a nonmagnetic material layer 6, a pinned magnetic layer 7, and an antiferromagnetic layer 8; an electrode layer 1 at the bottom of the composite film 9; an electrode layer 10 at the top of the composite film 9; hard bias layers 11 at the two sides of the free magnetic layer 5; insulating layers 12 formed at the bottom of the hard bias layers 11; and insulating layers 13 formed at the top of the hard bias layers 11.

The antiferromagnetic layers 2 and 8, the pinned magnetic layers 3 and 7, and the free magnetic layer 5 are composed of a ferromagnetic material such as NiFe. The nonmagnetic material layers 4 and 6 are composed of copper. The hard bias layers 11 are composed of a hard magnetic material such as CoPt. The insulating layers 12 and 13 are composed of alumina. The electrode layers 1 and 10 are composed of a conductive material such as chromium.

In the magnetic sensing element shown in FIG. 24, the nonmagnetic material layer 4 and the pinned magnetic layer 3 are disposed under the free magnetic layer 5, and the nonmagnetic material layer 6 and the pinned magnetic layer 7 are disposed above the free magnetic layer 5. Such a structure is called a "dual spin-valve magnetic sensing element". The dual spin-valve magnetic sensing element detects a magnetic field recorded on a recording medium such as a hard disk.

The magnetic sensing element shown in FIG. 24 is of a current-perpendicular-to-the-plane (CCP) type in which an electric current flows perpendicular to the surface of each layer of the composite film 9.

The magnetization directions of the pinned magnetic layers 3 and 7 are pinned in the Y direction in the drawing. The free magnetic layer 5 is put into a single-magnetic-domain state in the track width direction (the X direction in the drawing) by longitudinal bias magnetic fields from the hard bias layers 11 when no external magnetic field is applied. The magnetization direction of the free magnetic layer 5 changes by application of an external magnetic field, resulting in a change in electrical resistance of the composite film 9. The change in electrical resistance is output as a change in voltage or current to detect the external magnetic field.

The composite film 9 of the magnetic sensing element shown in FIG. 24 has two side faces 9a. Each of the side faces 9a is a continuous slope.

The magnetic sensing element having the composite film 9 of such a structure has the following drawbacks during the fabrication process.

FIGS. 25 to 27 are cross-sectional views showing the steps of making the magnetic sensing element shown in FIG. 24.

Referring to FIG. 25, solid layers of the antiferromagnetic layer 2, the pinned magnetic layer 3, the nonmagnetic material layer 4, the free magnetic layer 5, the nonmagnetic material layer 6, the pinned magnetic layer 7, and the antiferromagnetic layer 8 are deposited on the electrode layer 1 to form the composite film 9.

The composite film 9 is annealed in a magnetic field (field annealing) to generate exchange coupling magnetic fields in the Y direction between the antiferromagnetic layer 2 and the pinned magnetic layer 3 and between the antiferromagnetic layer 8 and the pinned magnetic layer 7. Subsequently, a resist layer R1 having a predetermined length in the track width direction is formed on the antiferromagnetic layer 8.

In the step shown in FIG. 26, the two side portions of the composite film 9 not covered by the resist layer R1 is removed by ion milling or reactive ion etching (RIE).

In an actual fabrication process, the material of the composite film 9 redeposits on the side faces 9a of the remaining portion of the composite film 9 to form redeposition layers A, as shown in FIG. 26. Since the thickness T of the antiferromagnetic layers 2 and 8 is large, i.e., approximately 200 Å, significant amounts materials of these layers redeposit on the composite film 9.

The redeposition layers A causes short-circuiting between the pinned magnetic layer 3 and the free magnetic layer 5 and between the pinned magnetic layer 7 and the free magnetic layer 5 and thereby decreases the magnetic detection outputs. Moreover, the redeposition layers A hinder the reduction in track width of the magnetic sensing element. Furthermore, the redeposition layers A degrade the quality of the magnetic sensing element.

The materials of the composite film 9 also redeposit on the side faces of the resist layer R1 to form redeposition layers B.

The redeposition layers B degrade accuracy of positioning the hard bias layers 11 during the deposition of the insulating layers 12, the hard bias layers 11, and the insulating layers 13 by sputtering using the resist layer R1 as a mask. Moreover, the resist layer R1 is difficult to remove.

In other words, the hard bias layers 11 do not come precisely at the two sides of the free magnetic layer 5 in the track width direction and may be shifted in the Z direction in the drawing. Moreover, the distance between the free magnetic layer 5 and each of the hard bias layers 11 may increase. These will result in a decrease in the magnetic detection outputs and poor in asymmetry of the output since the longitudinal bias magnetic fields cannot be stably supplied to the free magnetic layer 5.

SUMMARY OF THE INVENTION

Accordingly, it is an object of the present invention to provide a magnetic sensing element that can overcome the problems of the conventional art and exhibit high magnetic field detection output, high quality, and high compatibility to narrower tracks. The present invention also provides a method for making the magnetic sensing element.

A first aspect of the present invention provides a magnetic sensing element including a composite film including, in order from the bottom, a free magnetic layer; a first nonmagnetic material layer; a first pinned magnetic layer; and a first antiferromagnetic layer. An electric current flows in the composite film in a direction perpendicular to the surface of each layer of the composite film, and the length of the antiferromagnetic layer in a track width direction is larger than the length of the free magnetic layer in the track width direction.

With this structure, there is no need to remove two side portions of the antiferromagnetic layer in the track width direction so as to align with the free magnetic layer. As a result, the amounts of the materials of the composite film redepositing on the side faces of the free magnetic layer can be reduced, and short-circuiting between the free magnetic layer and the pinned magnetic layer can be prevented. The magnetic detection output and quality can thus be improved. The track width of the magnetic sensing element can be accurately controlled, thereby achieving high compatibility to narrower tracks.

Alternatively, the composite film may further include a second nonmagnetic material layer; a second pinned magnetic material layer; and a second antiferromagnetic material layer, which are disposed under the free magnetic layer. The length of the second antiferromagnetic layer in the track width direction is larger than the length of the free magnetic layer in the track width direction. This magnetic sensing element is of a dual spin-valve type. Since the absolute value of the electric resistance is large, the structure is suitable for increasing the magnetic detection output (read sensitivity).

With this structure, since the length of the second antiferromagnetic layer in the track width direction is larger than the length of the free magnetic layer in the track width direction, there is no need to remove two side portions of the second antiferromagnetic layer to align with the free magnetic layer. Accordingly, the amounts of materials of the composite film redepositing on the side faces of the free magnetic layer can be reduced, and short-circuiting between the free magnetic layer and the pinned magnetic layer can be prevented. The magnetic detection output and quality can thus be improved. The track width of the magnetic sensing element can be accurately controlled, thereby achieving high compatibility to narrower tracks.

Alternatively, the composite film may further include a nonmagnetic layer; a ferromagnetic layer; and a second antiferromagnetic layer.

In this structure, the ferromagnetic layer is magnetized in a direction orthogonal to the magnetization direction of the first pinned magnetic layer by an exchange coupling magnetic field with the second antiferromagnetic layer. The free magnetic layer is put into a single-magnetic-domain state by an interlayer coupling magnetic field working between the free magnetic layer and the ferromagnetic layer with the nonmagnetic layer therebetween. As a result, the free magnetic layer is magnetized in the direction orthogonal to the magnetization direction of the first pinned magnetic layer.

The single-magnetic-domain state and the magnetization direction of the free magnetic layer are controlled by adjusting the magnitude of the exchange coupling magnetic field between the second antiferromagnetic layer and the ferromagnetic layer and the magnitude of the interlayer coupling magnetic field, e.g., an RKKY interaction, between the ferromagnetic layer and the free magnetic layer. Since the control is achieved in these two stages, fine control can be easily achieved.

Since the single-magnetic-domain state and the magnetization direction of the free magnetic layer can be properly and easily controlled, the magnetic sensing element shows high compatibility to narrower tracks.

Moreover, the length of the second antiferromagnetic layer in the track width direction is larger than that of the free magnetic layer. Thus, there is no need to remove two side portions of the second antiferromagnetic layer to align with the free magnetic layer in a fabrication method described below.

Accordingly, the amounts of materials of the composite film redepositing on the side faces of the free magnetic layer can be reduced, and short-circuiting between the free magnetic layer and the pinned magnetic layer can be prevented. The magnetic detection output and quality can thus be improved. The track width of the magnetic sensing element can be accurately controlled, thereby achieving high compatibility to narrower tracks.

Preferably, the nonmagnetic layer is composed of at least one element selected from the group consisting of Ru, Rh, Ir, Cr, Re, and Cu. When the nonmagnetic layer is composed of Ru, the nonmagnetic layer preferably has a thickness in the range of 8 to 11 Å or in the range of 15 to 21 Å.

The ferromagnetic layer may include a first sublayer composed of NiFe or NiFeX wherein X is at least one element selected from the group consisting of Al, Si, Ti, V, Cr, Mn, Cu, Zr, Nb, Mo, Ru, Rh, Hf, Ta, W, Ir, and Pt; and a second sublayer composed of a ferromagnetic material containing cobalt. The first sublayer is in contact with the nonmagnetic layer, and the second sublayer is in contact with the second antiferromagnetic layer. Alternatively, the ferromagnetic layer may be a single layer composed of CoFeCr or CoFe.

Preferably, the free magnetic layer contains a magnetic region of NiFe or NiFeX, wherein X is at least one element selected from the group consisting of Al, Si, Ti, V, Cr, Mn, Cu, Zr, Nb, Mo, Ru, Rh, Hf, Ta, W, Ir, and Pt, and the magnetic region is in contact with the nonmagnetic layer.

In the present invention, the step of making the first antiferromagnetic layer is performed separately from the step of making the free magnetic layer and the first nonmagnetic material layer. Thus, a current limiting layer containing an insulating component and a conductive component can be easily made between the first nonmagnetic material layer and the first pinned magnetic layer or inside the first nonmagnetic material layer.

The magnetic sensing element of the present invention is of a CPP type. A sensing current flows perpendicular to the surface of each layer of the composite film. It is known that a CPP magnetic sensing element cannot exhibit high read output compared to a magnetic sensing element of a current-in-the-plane (CIP) type in which a sensing current flows parallel to the surface of each layer of the composite film, unless the optical track width O-Tw and the length MRh in the height direction of the CPP magnetic sensing element are 0.1 μm or less. This means that the element area must be 0.01 μm$^2$ or less.

Element size is decreasing as the recording density increases. However, current photolithographic technology cannot easily make magnetic sensing elements having an element area of 0.1 μm square. Moreover, if the element size is reduced excessively, magnetic sensing element cannot properly detect a leakage magnetic field from a recording medium, thereby causing degradation in output or in stability of the read waveform.

In this invention, a current limiting layer containing an insulating component and a conductive component is formed between the first nonmagnetic material layer and the first pinned magnetic layer or inside the first nonmagnetic material layer. With this structure, the sensing current flows only in the conductive component.

Thus, the sensing current flowing from the electrode layer to the first nonmagnetic material layer and the free magnetic layer via the current limiting layer flows only in regions against the conductive component. In other words, the current density locally increases in these regions.

According to this structure, the area of the element contributing to the magnetoresistive effect, hereinafter the "effective element area" in which the sensing current flows, can be reduced even when the element area of the free magnetic layer parallel to the layer surface, hereinafter, the "optical element area", is 0.01 $\mu m^2$ or more. Thus, a CPP magnetic sensing element with high read output can be easily made.

Since the element area of the free magnetic layer is large, i.e., 0.01 $\mu m^2$ or more, an external magnetic field from a recording medium can be effectively detected, and read output and stability in read waveform can be enhanced.

In the present invention, the length of the current limiting layer in the track width direction may be equal to that of the first nonmagnetic material layer.

In the present invention, the insulating component of the current limiting layer is preferably an insulating material film with a plurality of holes across the film, and the holes are preferably filled with a conductive material, the filled holes constituting the conductive component.

Alternatively, in the present invention, the insulating component may be an insulating material film with a groove extending in a direction parallel to the surface and penetrating the film, and the groove may be filled with a conductive material, the filled groove constituting the conductive component.

Alternatively, the insulating component may be an insulating material film with holes penetrating the film and a penetrating groove penetrating the film and extending in a direction parallel to the surface of the film, and the holes and the groove may be filled with a conductive material, the filled holes and the filled grooves constituting the conductive component.

The insulating material film may be an oxide film or a nitride film.

Preferably, the conductive component of the current limiting layer includes conductive particles, and the insulating component is an insulating material layer. The conductive particles are dispersed in the insulating material layer.

Alternatively, the insulating component may include insulating particles, and the conductive component may be a conductive material film, the insulating particles being dispersed in the conductive material film.

Since the above-described current limiting layer properly contains the insulating component and the conductive component, the element effective size can be properly reduced.

Another aspect of the present invention provides a magnetic sensing element including, in order from the bottom, a first antiferromagnetic layer; a pinned magnetic layer; a nonmagnetic material layer; a free magnetic layer; a nonmagnetic layer; a ferromagnetic layer; and a second antiferromagnetic layer. The length of the first antiferromagnetic layer and the second antiferromagnetic layer in a track width direction is larger than the length of the free magnetic layer in the track width direction.

According to this aspect of the invention, the ferromagnetic layer is magnetized in a direction orthogonal to the magnetization direction of the pinned magnetic layer by an exchange coupling magnetic field between the ferromagnetic layer and the second antiferromagnetic layer. The free magnetic layer is put into a single-magnetic-domain state by an interlayer coupling magnetic field, e.g., an RKKY interaction, between the free magnetic layer and the ferromagnetic layer with the nonmagnetic layer therebetween. The free magnetic layer is thereby magnetized in a direction orthogonal to the magnetization direction of the pinned magnetic layer.

The single-magnetic-domain state and the magnetization direction of the free magnetic layer are controlled by adjusting the magnitude of the exchange coupling magnetic field between the second antiferromagnetic layer and the ferromagnetic layer and the magnitude of the interlayer coupling magnetic field, e.g., an RKKY interaction, between the ferromagnetic layer and the free magnetic layer. Since the control is achieved in these two stages, fine control can be easily achieved. The magnetic sensing element thus exhibits high compatibility to narrower tracks.

Since the length of the first and second antiferromagnetic layers in the track width direction is larger than that of the free magnetic layer, there is no need to remove side portions of the first and second antiferromagnetic layers so as to align with the free magnetic layer.

Thus, the amounts of materials redepositing on the side faces of the free magnetic layer can be decreased. Short-circuiting between the free magnetic layer and the pinned magnetic layer can be partly or completely reduced. The magnetic field detection output and quality can be improved, and the track width of the magnetic sensing element can be accurately controlled, thereby enhancing compatibility to narrower tracks.

Preferably, the nonmagnetic layer is composed of at least one element selected from the group consisting of Ru, Rh, Ir, Cr, Re, and Cu.

Another aspect of the present invention provides a method for making a magnetic sensing element, including the steps of (a) forming a composite film by sequentially stacking a first electrode layer, a free magnetic layer, a first nonmagnetic material layer, and a protective layer, in order from the bottom; (b) removing two side portions of each of the free magnetic layer, the first nonmagnetic material layer, and the protective layer; (c) sequentially forming a first pinned magnetic layer and a first antiferromagnetic layer on the protective layer, or removing the protective layer to expose the first nonmagnetic material layer and then forming a first pinned magnetic layer and a first antiferromagnetic layer on the first nonmagnetic material layer, the length of the first pinned magnetic layer and the first antiferromagnetic layer in a track width direction being larger than the length of the free magnetic layer and the first nonmagnetic material layer in the track width direction; and (d) forming a second electrode layer on the first antiferromagnetic layer.

In step (b) above, two side portions of each of the free magnetic layer, the first nonmagnetic material layer, and the protective layer are removed before the first pinned magnetic layer and the first antiferromagnetic layer are deposited. There is no need to remove the side portions of the first pinned magnetic layer and the first antiferromagnetic layer to align with the free magnetic layer.

In this manner, the amounts of materials of the composite film redepositing on the side faces of the free magnetic layer can be decreased. Short-circuiting between the free magnetic layer and the first pinned magnetic layer can be partially or completely eliminated, thereby improving the magnetic detection output and quality. The track width of the magnetic sensing element can be accurately controlled, thereby achieving high compatibility to narrower tracks.

Since the length of the first pinned magnetic layer in the track width direction is large, the demagnetizing fields in the track width direction can be weakened, and the magnetization direction of the pinned magnetic layer can be easily pinned in a direction perpendicular to the track width direction, i.e., in the height direction.

In step (a), a second antiferromagnetic layer may be formed on the first electrode layer, a second pinned magnetic layer may be formed on the second antiferromagnetic layer, a second nonmagnetic material layer may be formed on the second pinned magnetic layer, and the free magnetic layer may be formed on the second nonmagnetic material layer. The magnetic sensing element is of a dual spin-valve type. Since the absolute value of the electric resistance of the dual spin-valve magnetic sensing element is large, the structure is suitable for improving the magnetic detection output (read sensitivity) of the dual spin-valve magnetic sensing element.

Alternatively, in step (a), a second antiferromagnetic layer may be formed on the first electrode layer, a nonmagnetic layer may be formed on the second antiferromagnetic layer, a ferromagnetic layer may be formed on the nonmagnetic layer, and the free magnetic layer may be formed on the ferromagnetic layer.

The ferromagnetic layer is magnetized in a direction orthogonal to the magnetization direction of the first pinned magnetic layer by an exchange coupling magnetic field between the ferromagnetic layer and the second antiferromagnetic layer. The free magnetic layer is put into a single-magnetic-domain state by an interlayer coupling magnetic field, e.g., an RKKY interaction, between the free magnetic layer and the ferromagnetic layer with the nonmagnetic layer therebetween. Since the single-magnetic-domain state and the magnetization direction of the free magnetic layer are controlled by adjusting the magnitude of the exchange coupling magnetic field between the second antiferromagnetic layer and the ferromagnetic layer and the magnitude of the interlayer coupling magnetic field between the ferromagnetic layer and the free magnetic layer, fine control is possible.

Preferably, the protective layer is a current limiting layer containing an insulating component and a conductive component.

Alternatively, in step (c), a second nonmagnetic material layer may be formed on the protective layer before the pinned magnetic layer and the antiferromagnetic layer are formed. In this manner, a current limiting layer containing the insulating component and the conductive component can be formed inside the first nonmagnetic material layer.

When the protective layer is the current limiting layer, the method preferably includes, in step (a), the substeps of (a1) forming an insulating material film on the first nonmagnetic material layer, the insulating material film having a plurality of penetrating holes or a penetrating groove that extends in a direction parallel to the surface of the film; and (a2) sputter-depositing a conductive material film on the insulating material film to fill the holes or the groove with the conductive material film.

Preferably, the insulating material film is formed on the first nonmagnetic material layer and is discontinuous to form a plurality of holes across the insulating material film. In order to make the discontinuous insulating material film, materials and sputtering conditions must be adjusted. Here, examples of the sputtering conditions include substrate temperature, Ar gas pressure, distances between the substrate and the target, and the like.

In the present invention, copper is used in the first nonmagnetic material layer to easily form the discontinuous insulating material film. Since copper has low surface energy, atoms readily aggregate to form nuclei.

Preferably, in substep (a1), the insulating material film is formed by sputtering an insulating material composed of oxide of at least one element selected from the group consisting of Al, Si, Ti, Zr, Hf, Cr, Ta, V, Nb, Mo, W, Fe, Ni and Co, wherein the sputtering is stopped when holes penetrating the insulting material film or a groove extending in a direction parallel to the surface of the film and penetrating the insulting material film is formed.

Alternatively, in substep (a1), a precursor layer composed of at least one element selected from the group consisting of Ag, Cu, Zn, Ge, Pd, Al, Ti, Zr, Hf, Cr, Ta, V, Nb, Mo, W, Fe, Co, Si, Ni, and rare earth elements may be formed by sputtering; the sputtering may be stopped when holes penetrating the precursor layer or a groove extending in a direction parallel to the surface of the film and penetrating the precursor layer is formed; and the precursor layer may be oxidized to make the insulating material film.

Alternatively, in substep (a1), the insulating material film may be formed by sputtering an insulating material composed of nitride of at least one element selected from the group consisting of Al, Si, Ti, Zr, Hf, Cr, Ta, V, Nb, Mo, W, Fe, Ni and Co, wherein the sputtering is stopped when holes penetrating the insulting material film or a groove extending in a direction parallel to the surface of the film and penetrating the insulating material film is formed.

Alternatively, in substep (a1), a precursor layer composed of at least one element selected from the group consisting of Ag, Cu, Zn, Ge, Pd, Al, Ti, Zr, Hf, Cr, Ta, V, Nb, Mo, W, Fe, Co, Si, Ni, and rare earth elements may be formed by sputtering; the sputtering may be stopped when holes penetrating the precursor layer or a groove extending in a direction parallel to the surface of the film and penetrating the precursor layer is formed; and the precursor layer may be nitrided to make the insulating material film.

In step (a), the protective film may be formed by sputter deposition and may be composed of $Fe_aM_bO_c$, wherein M is at least one element selected from the group consisting of Ti, Zr, Hf, Nb, Ta, Mo, W, and rare earth elements, that satisfies the relationships, in terms of atomic percent, $40 \leq a \leq 50$, $10 \leq b \leq 30$, $20 \leq c \leq 40$, and $a+b+c=100$, the protective film composed of an amorphous material composed of a compound of M and O and microcrystals mainly composed of Fe dispersed into the amorphous material. In this manner, the protective layer functions as the current limiting layer.

Alternatively, in step (a), the protective film may be formed by sputter deposition and may be composed of $Fe_dM_eN_f$, wherein M is at least one element selected from the group consisting of Ti, Zr, Hf, Nb, Ta, Mo, W, and rare earth elements, that satisfies the relationships, in terms of atomic percent, $60 \leq d \leq 70$, $10 \leq e \leq 15$, $19 \leq f \leq 25$, and $d+e+f=100$, the protective film composed of an amorphous material composed of a compound of M and N and microcrystals mainly composed of Fe dispersed into the amorphous material. In this manner, the protective layer functions as the current limiting layer.

In this invention, the composite film with the protective layer functioning as the current limiting layer is preferably annealed to accelerate oxidation of easily oxidizable elements in the film so as to adjust the ratio of the openings (holes) in the current limiting layer. The ratio of the openings to the entirety of the current limiting layer is preferably 10 to 30%.

Alternatively, in step (a), the protective layer may be formed by sputtering a material containing Co and at least one element selected from Ru, Pt, Au, Rh, Ir, Pd, Os, Re, Cu, and Ag, and the composite film may be annealed to oxidize Co. In this manner the protective layer functions as the current limiting layer.

Preferably, in step (a), the protective layer is formed using at least one element selected from the group consisting of Ru, Rh, Ir, Cr, Re and Cu. In this manner, the thickness of the oxide layer at the surface of the protective small is small, i.e., 3 to 6 Å, facilitating removal of the oxide layer.

BRIEF DESCRIPTION OF THE DRAWINGS

FIG. 4 is a cross-sectional view of a magnetic sensing element according to a second embodiment of the present invention viewed from the opposing face;

FIG. 26 shows another step of making the conventional magnetic sensing element.

DESCRIPTION OF THE PREFERRED EMBODIMENTS

First Embodiment

Figure 1:
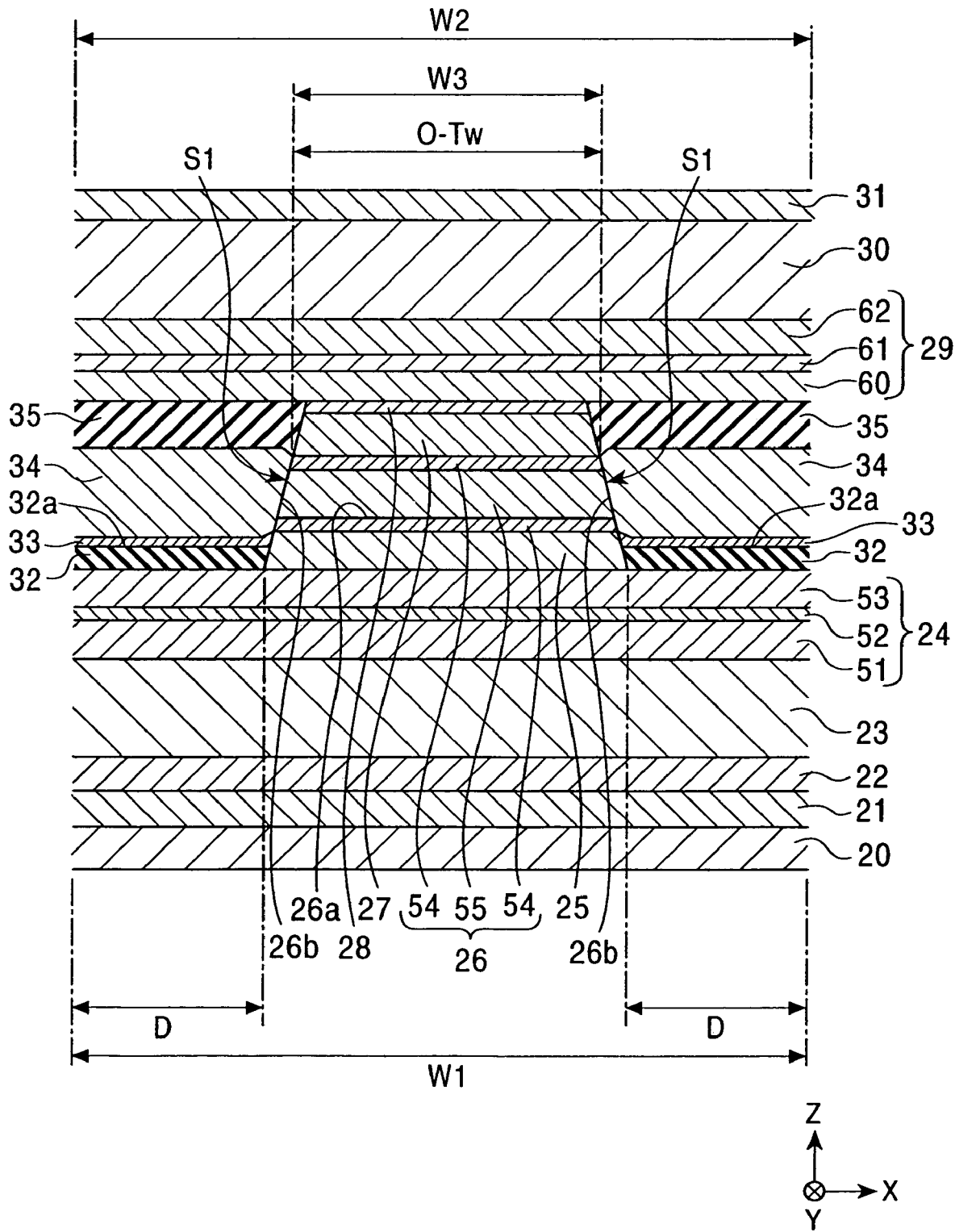
FIG. 1 is a cross-sectional view of a magnetic sensing element according to a first embodiment of the present invention viewed from the opposing face.

FIG. 1 is a cross-sectional view showing an overall structure of a magnetic sensing element according to a first embodiment of the present invention viewed from the opposing face. The magnetic sensing element is of a dual spin-valve type.

The magnetic sensing element includes a first electrode layer 20 composed of, for example, α-Ta, Au, Cr, Cu, or W.

An underlayer 21 is formed on the upper face of the first electrode layer 20. The underlayer 21 is preferably composed of at least one of Ta, Hf, Nb, Zr, Ti, Mo and W. The thickness of the underlayer 21 is 50 Å or less. Alternatively, no underlayer 21 may be formed.

A seed layer 22 is disposed on the underlayer 21. The seed layer 22 is mainly face-centered cubic and has the (111) faces preferentially oriented in a direction parallel to the interface with a lower antiferromagnetic layer 23 described below. The seed layer 22 is preferably composed of elemental Cr, a NiFe alloy, or a Ni—Fe—Y alloy wherein Y is at least one element selected from Cr, Rh, Ta, Hf, Nb, Zr, and Ti. When the seed layer 22 composed of such a material is disposed on the Ta underlayer 21, it becomes easier to orient the (111) faces of the seed layer 22 in a direction parallel to the interface with the lower antiferromagnetic layer 23. The thickness of the seed layer 22 is, for example, approximately 30 Å.

Since the magnetic sensing element of the present invention is of CPP type in which a sensing current flows perpendicular to the surface of each layer, the sensing current must properly flow in the seed layer 22. Thus, the material for the seed layer 22 preferably has a low resistivity. In particular, the seed layer 22 of the CPP magnetic sensing element is preferably composed of a material, such as a NiFe alloy, having low resistivity. Alternatively, no seed layer 22 may be formed.

The lower antiferromagnetic layer (second antiferromagnetic layer) 23 is disposed on the seed layer 22. The lower antiferromagnetic layer 23 is preferably composed of an antiferromagnetic material containing Mn and X, wherein X is at least one element selected from Pt, Pd, Ir, Rh, Ru, and Os. Alternatively, the lower antiferromagnetic layer 23 is preferably composed of an antiferromagnetic material containing Mn, X described above, and X', wherein X' is at least one element selected from Ne, Ar, Kr, Xe, Be, B, C, N, Mg, Al, Si, P, Ti V, Cr, Fe, Co, Ni, Cu, Zn, Ga, Ge, Zr, Nb, Mo, Ag, Cd, Sn, Hf, Ta, W, Re, Au, Pb, and rare earth elements.

These antiferromagnetic materials have superior corrosion resistance and high blocking temperatures. With these materials, large exchange anisotropic magnetic fields can be generated at the interface with a lower pinned magnetic layer 24 described below. The thickness of the lower antiferromagnetic layer 23 is preferably 80 Å to 300 Å. For example, the lower antiferromagnetic layer 23 is 200 Å in thickness.

A lower pinned magnetic layer 24 is disposed on the lower antiferromagnetic layer 23. In this embodiment, the lower pinned magnetic layer 24 is constituted from three sublayers.

In particular, the lower pinned magnetic layer 24 is constituted from magnetic sublayers 51 and 53 and an intermediate sublayer 52 disposed between the magnetic sublayers 51 and 53. The magnetic sublayers 51 and 53 are composed of, for example, elemental Co, CoFe, NiFe, or CoFeNi. The intermediate sublayer 52 is composed of, for example, Ru. This structure puts the magnetization directions of the magnetic sublayers 51 and 53 in an antiparallel state and is called a "synthetic ferrimagnetic structure".

An exchange anisotropic magnetic field is induced between the lower antiferromagnetic layer 23 and the upper electrode layer 51, which is the bottommost sublayer of the lower pinned magnetic layer 24 in contact with the lower antiferromagnetic layer 23, by field annealing. For example, when the magnetization direction of the magnetic sublayer 51 is pinned in the height direction (the Y direction in the drawing), the magnetization direction of the magnetic sublayer 53 is pinned in a direction opposite to the height direction (opposite to the Y direction) by a Ruderman-Kittel-Kasuya-Yosida (RKKY) interaction. According to this structure, the magnetization direction of the lower pinned magnetic layer 24 can be stabilized and can be firmly pinned.

The thickness of the magnetic sublayers 51 and 53 is each approximately 10 to 70 Å. The thickness of the intermediate sublayer 52 is approximately 3 to 10 Å.

The magnetic sublayers 51 and 53 are composed of different materials and/or are formed at different thickness so that the magnetic moment per unit area differs between the magnetic sublayers 51 and 53. The magnetic moment per unit area is determined by saturation magnetization Ms×thickness t. For example, when the magnetic sublayers 51 and 53 are composed of the same material, i.e., the same elements at the same composition, the magnetic moment may be made different between the magnetic sublayers 51 and 53 by making the thickness of the magnetic sublayers 51 and 53 different from each other. In this manner, the magnetic sublayers 51 and 53 can properly form a synthetic ferrimagnetic structure.

Alternatively, the lower pinned magnetic layer 24 may have a structure other than the ferrimagnetic structure. For example, the lower pinned magnetic layer 24 may be a composite film or a single layer composed of a NiFe alloy, a NiFeCo alloy, or a CoFe alloy.

A lower nonmagnetic material layer 25 is disposed on the lower pinned magnetic layer 24. The lower nonmagnetic material layer 25 is composed of, for example, a conductive material, such as Cu, Cr, Au, or Ag, having low electric resistance. The thickness of the lower nonmagnetic material layer 25 is, for example, approximately 25 Å.

A free magnetic layer 26 is disposed on the center portion of the lower nonmagnetic material layer 25 in the drawing. The free magnetic layer 26 is constituted from three sublayers, namely, two Co sublayers 54 and a magnetic sublayer 55. One of the Co sublayers 54 of the free magnetic layer 26 is preferably in contact with the lower nonmagnetic material layer 25 to prevent diffusion of metal elements at the interface and to increase the rate of change in resistance (ΔGMR). A magnetic sublayer 55 composed of a NiFe alloy, a CoFe alloy, elemental Co, a CoNiFe alloy is formed on the Co sublayer 54. The other Co sublayer 54 is formed on the magnetic sublayer 55 to prevent diffusion. The thickness of the free magnetic layer 26 as a whole is preferably in the range of approximately 20 to 100 Å.

Alternatively, the free magnetic layer 26 may be a single layer composed of any one of the magnetic materials described above. Alternatively, the free magnetic layer 26 may have a synthetic ferrimagnetic structure including two magnetic sublayers having different magnetic moments per unit area and an intermediate sublayer disposed between the two magnetic sublayers and composed of Ru, the magnetization directions of the two magnetic sublayers being oriented antiparallel to each other.

An upper nonmagnetic material layer (first nonmagnetic material layer) 27, a current limiting layer 28, an upper pinned magnetic layer 29, an upper antiferromagnetic layer 30, and a second electrode layer 31 are sequentially deposited on the free magnetic layer 26. The upper pinned magnetic layer 29 has a three-layer ferrimagnetic structure comprising magnetic sublayers 60 and 62 and an intermediate sublayer 61 composed of Ru or the like.

The materials and the thicknesses of the upper nonmagnetic material layer 27, the upper pinned magnetic layer 29, the upper antiferromagnetic layer 30, and the second electrode layer 31 are the same as those of the lower nonmagnetic material layer 25, the lower pinned magnetic layer 24, the lower antiferromagnetic layer 23, and the first electrode layer 20, respectively. The structure of the current limiting layer 28 will be explained later in detail.

In the dual spin-valve thin film element shown in FIG. 1, when the magnetization direction of the magnetic sublayer 53 is pinned in a direction antiparallel to the height direction (the Y direction in the drawing), the magnetization direction of the magnetic sublayer 60 is also pinned in the direction antiparallel to the height direction (the Y direction in the drawing). The magnetic sublayer 53 and the magnetic sublayer 60 are the layers that contribute to the magnetoresistive effect.

Referring again to FIG. 1, two insulating layers 32 are formed on the lower pinned magnetic layer 24 at two side regions D. The insulating layers 32 are composed of a common insulating material such as $Al_2O_3$, $SiO_2$, or the like.

Upper faces 32a of the insulating layers 32 are preferably positioned lower than a lower face 26a of the free magnetic layer 26 in the drawing. In other words, the upper face 32a is away from the lower face 26a in a direction opposite to the Z direction.

A bias underlayer 33 is formed on each of the insulating layers 32, and a hard bias layer 34 is formed on each bias underlayer 33. The hard bias layers 34 are placed against the side faces of the free magnetic layer 26. The hard bias layers 34 are magnetized in the track width direction (the X direction in the drawing). The magnetization direction of the free magnetic layer 26 is oriented in the X direction in the drawing by the longitudinal bias magnetic fields from the hard bias layers 34.

The bias underlayers 33 improve the characteristics, i.e., the coercive force Hc, and the remanence ratio S, of the hard bias layers 34.

In the prevent invention, the bias underlayers 33 are preferably metal films having a body-centered cubic (bcc) structure. Preferably, the (100) faces of the bias underlayers 33 are preferentially aligned.

The hard bias layers 34 are composed of a CoPt ally or a CoPtCr alloy. These alloys have a single phase of a hexagonal close-packed (hcp) structure or a mixed phase of a body-centered cubic (fcc) structure and a hexagonal close-packed (hcp) structure.

The lattice constant of the bias underlayer 33 composed of the above-described metal becomes nearly the same as that of the hcp-structure CoPt alloy constituting the hard bias layers 34. Thus, the CoPt alloy rarely enters a fcc structure but often enters a hcp structure. The c axis of the hcp structure is preferentially oriented in the plane of the interface between the bias underlayer 33 and the hard bias layer 34 composed of the CoPt alloy. Since the hcp structure produces a large magnetic anisotropy in the c-axis direction compared to the fcc structure, the coercive force Hc becomes large when a magnetic field is applied to the hard bias layers 34. Moreover, since the c-axis of the hcp structure is preferentially oriented in the plane of the interface between the CoPt alloy and the bias underlayer, the residual magnetization is increased, resulting in an increase in remanence ratio S, which is determined by residual magnetization/saturation magnetic flux density. As a result, the characteristics of the hard bias layers 34 can be improved, and the magnitude of the bias magnetic fields generated from the hard bias layers 34 can be increased. The metal having a bcc structure preferably contains at least one of Cr, W, Mo, V, Mn, Nb, and Ta.

Preferably, the bias underlayers 33 are provided only at the bottom of the hard bias layers 34. However, the bias underlayer 33 may be provided between each of two side faces 26b of the free magnetic layer 26 and each of the hard bias layers 34. In such a case, the thickness of the bias underlayer 33 that comes between the side face 26b of the free magnetic layer 26 and the hard bias layer 34 in the track width direction (the X direction) is preferably 1 nm or less.

According to this structure, the hard bias layers 34 and the free magnetic layer 26 are magnetically continuous. The problem of a buckling phenomenon caused by the demagnetizing fields at the side ends of the free magnetic layer 26 can be prevented, and the magnetization of the free magnetic layer 26 can be easily controlled.

As shown in FIG. 1, an insulating layer 35 is formed on each of the hard bias layers 34. The insulating layer 35 is composed of a common insulating material such as $Al_2O_3$ or $SiO_2$.

In this embodiment, the upper faces of the insulating layers 35 are flush with the upper face of the current limiting layer 28.

In this embodiment, a sensing current flows from the second electrode layer 31 to the first electrode layer 20. Alternatively, the sensing current may flow from the first electrode layer 20 to the second electrode layer 31. The sensing current flows perpendicular to the surface of each layer of the magnetic sensing element. When a sensing current flows in such directions, the magnetic sensing element is of a CPP type.

When a detecting current (sensing current) is supplied to the upper pinned magnetic layer 29, the upper nonmagnetic material layer 27, the free magnetic layer 26, the lower nonmagnetic material layer 25, and the lower pinned magnetic layer 24 and a leakage magnetic field from a recording medium such as hard disk traveling in the Z direction is applied in the Y direction, the magnetization direction of the free magnetic layer 26 shifts toward the Y direction from the X direction in the drawing. The change in magnetization direction within the free magnetic layer 26 relative to the magnetization directions of the upper and lower pinned magnetic layers changes the electric resistance, i.e., produces the magnetoresistive effect. The change in voltage or current resulting from the change in electric resistance allows detection of the leakage magnetic field from the recording medium.

Although not shown in the drawing, gap layers are formed on and under the magnetic sensing element shown in FIG. 1, and shield layers are formed on the gap layers. The magnetic sensing element, the gap layers, and the shield layers constitute a magnetoresistive (MR) head.

It should be noted here that the first electrode layer 20 and the second electrode layer 31 may function as the gap layers. When the first electrode layer 20 and the second electrode layer 31 are formed with a magnetic material, they may also function as the shield layers.

Moreover, an inductive write head may be formed on the MR head. In such a case, the shield layer, i.e., an upper shield layer, above the magnetic sensing element may function as a lower core layer of the inductive head.

The MR head is formed on, for example, a trailing end face of a slider composed of alumina-titanium carbide ($Al_2O_3$—Tic). The slider is coupled to an elastic supporting member composed of stainless steel or the like at the face of the slide remote from the recording medium to constitute a magnetic head device.

In the magnetic sensing element shown in FIG. 1, the side faces of the lower nonmagnetic material layer 25, the free magnetic layer 26, the upper nonmagnetic material layer 27, and the current limiting layer 28 are flush with each other and form sloped side faces S1.

The length W1 of the lower pinned magnetic layer 24 and the lower antiferromagnetic layer 23 in the track width direction and the length W2 of the upper pinned magnetic layer 29 and the upper antiferromagnetic layer 30 in the track width direction are larger than the length W3 of the free magnetic layer 26 in the track width direction. In making the magnetic sensing element shown in FIG. 1, there is no need to remove the side portions of the lower pinned magnetic layer 24, the lower antiferromagnetic layer 23, the upper pinned magnetic layer 29, and the upper antiferromagnetic layer 30 to align with the free magnetic layer 26.

Accordingly, redeposition of the materials of the lower pinned magnetic layer 24, the lower antiferromagnetic layer 23, the upper pinned magnetic layer 29, and the upper antiferromagnetic layer 30 on the side faces of the free magnetic layer 26 can be prevented. The short-circuiting between the free magnetic layer 26 and the upper pinned magnetic layer 29 and between the free magnetic layer 26 and the lower pinned magnetic layer 24 can be decreased or eliminated. As a result, the sensitivity to magnetic field can be enhanced, and the quality can be improved.

Furthermore, the distance between the free magnetic layer 26 and each hard bias layer 34 can be properly controlled.

The optical track width O-Tw defined by the length W3 of the free magnetic layer 26 in the track width direction can be accurately controlled, and compatibility to narrower tracks can be enhanced.

Because the length W2 and W1 of the upper pinned magnetic layer 29 and the lower pinned magnetic layer 24, respectively, are large, the demagnetizing fields in the track width direction are weak. In this manner, the magnetization directions of the upper pinned magnetic layer 29 and the lower pinned magnetic layer 24 can be easily pinned in a direction perpendicular to the track width direction, i.e., the Y direction (height direction).

In this embodiment, as shown in FIG. 1, the current limiting layer 28 is provided between the upper nonmagnetic material layer 27 and the upper pinned magnetic layer 29.

Figure 2:
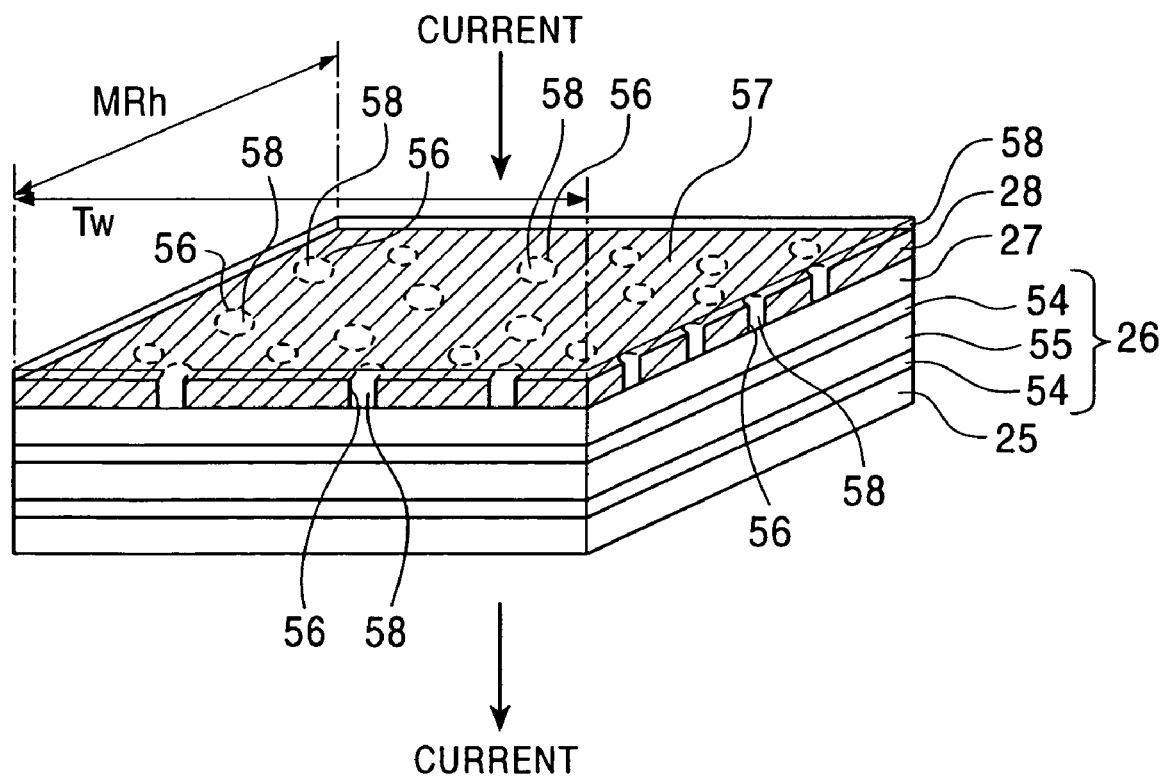
FIG. 2 is a partial schematic diagram showing the structure of the composite film and the current limiting layer of the present invention.

The structure of the current limiting layer 28 is shown in FIG. 2. FIG. 2 is a partial schematic diagram of the lower nonmagnetic material layer 25, the free magnetic layer 26, the upper nonmagnetic material layer 27, and the current limiting layer 28.

As shown in FIG. 2, the base material of the current limiting layer 28 is an insulating material film (insulating component) 57 having a plurality of holes 56. At least some of the holes 56 are through holes penetrating the insulating material film 57.

Referring again to FIG. 2, a conductive material film (conductive component) 58 is formed over the insulating material film 57. The holes 56 formed in the insulating material film 57 are filled with the conductive material film 58. Note that in FIG. 2, reference numerals 56 and 58 are provided to only some of the holes and the conductive material film in the holes for the purpose of explanation.

The insulating material film 57 is preferably an oxide film or a nitride film. The oxide film is preferably composed of an insulating material containing oxide of at least one element selected from the group consisting of Ag, Cu, Zn, Ge, Pd, Al, Ti, Zr, Hf, Cr, Ta, V, Nb, Mo, W, Fe, Co, Si, Ni, and rare earth elements. The nitride film is preferably composed of an insulating material containing nitride of at least one element selected from the group consisting of Ag, Cu, Zn, Ge, Pd, Al, Ti, Zr, Hf, Cr, Ta, V, Nb, Mo, W, Fe, Co, Si, Ni, and rare earth elements.

When these oxide and nitride films are formed on the upper nonmagnetic material layer 27 at a small thickness, aggregation occurs during sputter deposition and the resulting film tends to be discontinuous. When the film is discontinuous, holes, such as the holes 56, penetrating the insulating material film 57 are readily formed in the insulating material film 57, as shown in FIG. 2.

Whether the resulting film will be discontinuous or not depends not only on the selection of the material but also on the sputtering conditions. In order to deposit a discontinuous insulating material film 57, the substrate temperature may be decreased to 20 to 200° C., the Ar gas pressure may be increased to approximately 10 to 50 mTorr (1.3 to 6.7 Pa), or the distance between the substrate and the target may be increased to approximately 200 to 300 mm, for example.

Examples of the sputtering method include a RF sputtering method, a RF magnetron sputtering method, a DC magnetron sputtering method, an ion beam sputtering method, a long throw sputtering method, and a collimation sputtering method. These methods may be employed alone or in combination.

The conductive material film 58 may be composed of a common conductive material such as α-Ta, Au, Cr, Cu, or W. Alternatively, the conductive material film 58 may be composed of at least one noble metal element selected from Ru, Pt, Au, Rh, Ir, Pd, Os, and Re. Copper may be added to the noble metal. The conductive material film 58 is preferably composed of the same material as the upper nonmagnetic material layer 27.

Noble metal elements are not easily oxidizable. Oxygen diffusion due to annealing can be inhibited by forming the conductive material film 58 composed of noble metal on the insulating material film 57 and in the holes 56. As a result, the contrast between the openings (holes) and the regions other than the openings (the insulating material layer) can be maintained at a suitable level.

The following effects can be expected from the present invention that provides the current limiting layer 28 including conducting regions and insulating regions on the upper nonmagnetic material layer 27.

A sensing current flows in the current limiting layer 28 of the CPP magnetic sensing element from the second electrode layer 31 in a direction perpendicular to the surface of the layer. In the present invention, the current limiting layer 28 is formed by filling the holes 56 in the insulating material film 57 with the conductive material film 58. In this manner, the sensing current flows only in the conductive material film 58.

Accordingly, the sensing current flowing into the free magnetic layer 26 from the second electrode layer 31 via the current limiting layer 28 is supplied only to the regions of the free magnetic layer 26 disposed against the conductive material film 58. In other words, the current density becomes locally high at these regions.

Thus, according to the present invention, the effective element area of the free magnetic layer 26 can be reduced although the optical element area of the free magnetic layer 26 is large. Here, the term "optical element area" means the area of the free magnetic layer 26 in a direction parallel to the surface, and the term "effective element area" means the area of the free magnetic layer 26 in which the sensing current flows, that contributes to the magnetoresistive effect. A CPP magnetic sensing element with high read output can be easily fabricated from a magnetic sensing element having a large optical element size by using a photolithographic technique of a conventional accuracy.

Note that in the present invention, the track width Tw shown in FIG. 2 is 0.15 to 0.3 μm, the length MRh in the height direction 0.15 to 0.3 μm, and the optical element area is 0.02 to 0.09 μm$^2$, which is large.

In the present invention, the effective element area is preferably 0.01 μm$^2$ or less. The effective element area can be determined as the product of the optical element area (Tw×MRh) and the opening (the holes 56) ratio. The opening ratio can be roughly determined from the difference in resistance between the GMR film alone and the entire element including electrodes.

The ratio of the current limiting layer 28 occupied by the openings (holes 56) is preferably approximately 10 to 30% when viewed in a plane parallel to the surface of the current limiting layer 28.

Since the element optical size is large in the present invention, an external magnetic field from a recording medium can be effectively detected by the magnetic sensing element. A CPP magnetic sensing element with high sensitivity and superior reach characteristics can be fabricated.

In the present invention, the structure of the current limiting layer 28 is not limited to that shown in FIG. 2. An alternative structure is shown in FIG. 3.

Figure 3:
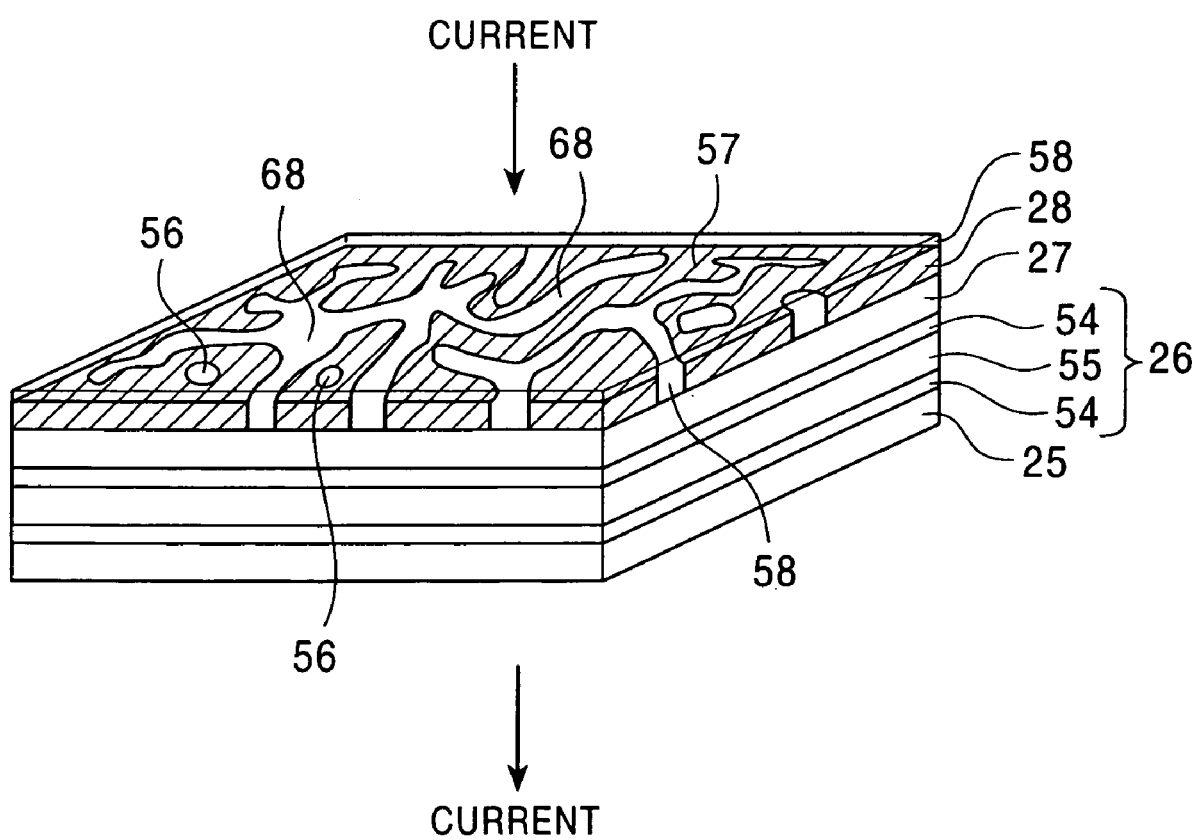
FIG. 3 is a partial schematic diagram showing the structure of the composite film and another current limiting layer of the present invention.

Referring now to FIG. 3, grooves 68 that penetrate the current limiting layer 28 are formed in the insulating material film 57 of the current limiting layer 28. The shape of the groove 68 in a plan view may be a curved line with or without branching or any other shape. The conductive material film 58 is formed over the insulating material film 57 and in the grooves 68. The difference in shape of the insulating material film 57 between those shown in FIGS. 2 and 3 is due to the difference in the method of forming nuclei of the thin film. A thin film, which is the insulating material film 57 or the base film for the insulating material film 57, is first grown on the upper nonmagnetic material layer 27 as an island film. When grown further, the islands start to make contact to each other, thereby forming the grooves 68 shown in FIG. 3.

The shape of the current limiting layer 28 in a plan view is determined by at what stage the growth of the thin film is stopped. It is necessary to adequately form the holes 56 or the grooves 68 penetrating the insulating material film 57 of the current limiting layer 28. Because the holes 56 or the grooves 68 penetrate the insulating material film 57, the conductive material film 58 that fills the holes 56 or the grooves 68 can function as the path for supplying an electric current to the upper nonmagnetic material layer 27, thereby properly narrowing the current path.

Moreover, as shown in FIG. 3, the insulating material film 57 of the current limiting layer 28 may have both the holes 56 penetrating the current limiting layer 28 and the grooves 68 penetrating the current limiting layer 28.

Although the current limiting layer 28 in FIG. 2 is constituted from the insulating material film 57 with the holes 56 and the conductive material film 58 that fills the holes 56, the current limiting layer 28 may instead have the following structure.

For example, a target composed of the insulating material and a target composed of the conductive material are prepared, and sputtering is performed by simultaneously using the two targets to form the current limiting layer 28 containing both the particles of the insulating material and the particles of the conductive material on the upper nonmagnetic material layer 27.

In particular, the conductive particles form the conductive regions of the current limiting layer 28 and are scattered within the insulating material film.

To be more specific, the current limiting layer 28 is constituted from microcrystalline particles mainly containing Fe, and an amorphous insulating region containing M and one of O and N, wherein M is at least one element selected from the group consisting of Ti, Zr, Hf, Nb, Ta, Mo, W, and rare earth elements. The microcrystalline particles are dispersed in the amorphous insulating region.

The current limiting layer 28 is preferably composed of $Fe_aM_bO_c$, wherein a, b, and c satisfy the relationships: $40 \leq a \leq 50$, $10 \leq b \leq 30$, $20 \leq c \leq 40$, and $a+b+c=100$, in terms of atomic percent.

Alternatively, the current limiting layer 28 is preferably composed of $Fe_dM_eN_f$, wherein d, e, and f satisfy the relationships: $60 \leq d \leq 70$, $10 \leq e \leq 15$, $19 \leq f \leq 25$, and $d+e+f=100$, in terms of atomic percent.

The current limiting layer 28 of such a structure may be formed by sputtering using an Fe target and a $HfO_2$ target. In this manner, the current limiting layer 28 constituted from an amorphous matrix and a large number of microcrystals mainly composed of bcc Fe precipitated inside the matrix can be formed.

Examples of the sputtering method include a RF sputtering method, a RF magnetron sputtering method, a DC magnetron sputtering method, an ion beam sputtering method, a long throw sputtering method, and a collimation sputtering method. These methods may be employed alone or in combination.

Alternatively, the current limiting layer 28 may be constituted from an insulating material film mainly composed of oxidized cobalt and conductive particles dispersed in the insulating material film. The conductive particles may be composed of at least one noble metal selected from the group consisting of Ru, Pt, Au, Rh, Ir, Pd, Os, Re, Cu, and Ag.

Alternatively, the insulating region of the current limiting layer 28 may be constituted from insulating particles, and the insulating particles may be dispersed in a conductive material film functioning as a conductive region.

Note that the conductive particles may be composed of any common conductive material such as copper. The insulating particles may be composed of a common insulating material such as $Al_2O_3$.

When the current limiting layer 28 is a granular film containing conductive particles as described above, the thickness of the current limiting layer 28 must be smaller than the grain diameter of the conductive particles. Otherwise, the conductive particles do not properly function as the path for sensing current and the read characteristics such as output is degraded.

In this embodiment, the current limiting layer 28 is formed on the upper nonmagnetic material layer 27 composed of a material, such as Cu, having a low surface energy. Thus, the contrast in conductivity between the openings (holes) in the current limiting layer 28 and the regions other than the openings (the insulating material film) can be increased, and the sensing current from the electrode layer can be properly narrowed at the openings. As a result, the apparent $\Delta R*A$ (change in resistance * element area) can be improved.

To be more specific, the insulating material film of the current limiting layer 28 is formed by cohesion of islands. The openings must be randomly and homogeneously contained in the film and must be small. One of the important factors for control is the material and the sputtering conditions. Another important factor is the surface energy ($\gamma s$) of the base film formed under the current limiting layer 28.

When the surface energy of the base film is high, the thin film tends to grow in a completely wetting mode, i.e., in a layer-by-layer mode also known as the Franck-van der Merwe (FM) mode. A paper titled "Hakumaku seicho purosesu gairon (General study on thin-film deposition processes)", Monthly Journal of the Magnetics Society of Japan, vol. 14, No. 3, 1990, teaches in page 528 that when $\gamma s > \gamma fs + \gamma f$, $\gamma fs$ being the interfacial energy between the thin film and the substrate and $\gamma f$ being the surface energy of the thin film, a thin film grows layer-by-layer in a completely wetting mode.

In order to prevent the layer-by-layer growth and to achieve the island growth, the surface energy $\gamma s$ must be decreased.

Since the surface energy of the upper nonmagnetic material layer 27 composed of copper is low, the precursor of the insulating material film of the current limiting layer 28 grows in the island mode on the upper nonmagnetic material layer 27. This growth mode is also known as the Volmer-Weber (VW) growth.

In forming the insulating material film by oxidizing the precursor metal film grown in the island mode on the upper nonmagnetic material layer 27, the oxidation does not affect the layers due to the upper nonmagnetic material layer 27.

Accordingly, the insulating material film constituting the current limiting layer 28 remains in the island shape. This maintains high contrast between the openings and the regions other than the openings.

Second Embodiment

FIG. 4 is a cross sectional view showing the overall structure of a dual spin-valve magnetic sensing element according to a second embodiment of the present invention viewed from the opposing face.

The magnetic sensing element shown in FIG. 4 differs from the magnetic sensing element shown in FIG. 1 in that the current limiting layer 28 is formed within an upper nonmagnetic material layer 70.

The upper nonmagnetic material layer 70 is constituted from a lower sublayer 71 and an upper sublayer (second nonmagnetic material layer) 72. The two side faces of the lower sublayer 71 are flush with the two side faces of the free magnetic layer 26 and the two side faces of the current limiting layer 28. The two side faces of the upper sublayer 72 are flush with the two side faces of the upper pinned magnetic layer 29 and the two side faces of the upper antiferromagnetic layer 30. The lower sublayer 71 and the upper sublayer 72 are both composed of copper.

The current limiting layer 28 is disposed between the lower sublayer 71 and the upper sublayer 72.

In the magnetic sensing element shown in FIG. 4 also, the length W1 of the lower pinned magnetic layer 24 and the lower antiferromagnetic layer 23 in the track width direction and the length W2 of the upper pinned magnetic layer 29 and the upper antiferromagnetic layer 30 are larger than the length W1 of the free magnetic layer 26 in the track width direction. The same advantages as those of the magnetic sensing element shown in FIG. 1 can be achieved.

Since the Cu upper sublayer 72 of the upper nonmagnetic material layer 70 is formed on the current limiting layer 28, oxygen diffusion into the layers above the current limiting layer 28 do not occur even when annealing is performed after the formation of the current limiting layer 28. Thus, in the current limiting layer 28, the contrast between the openings and regions other than the openings can be maintained at a high level.

Third Embodiment

Figure 5:
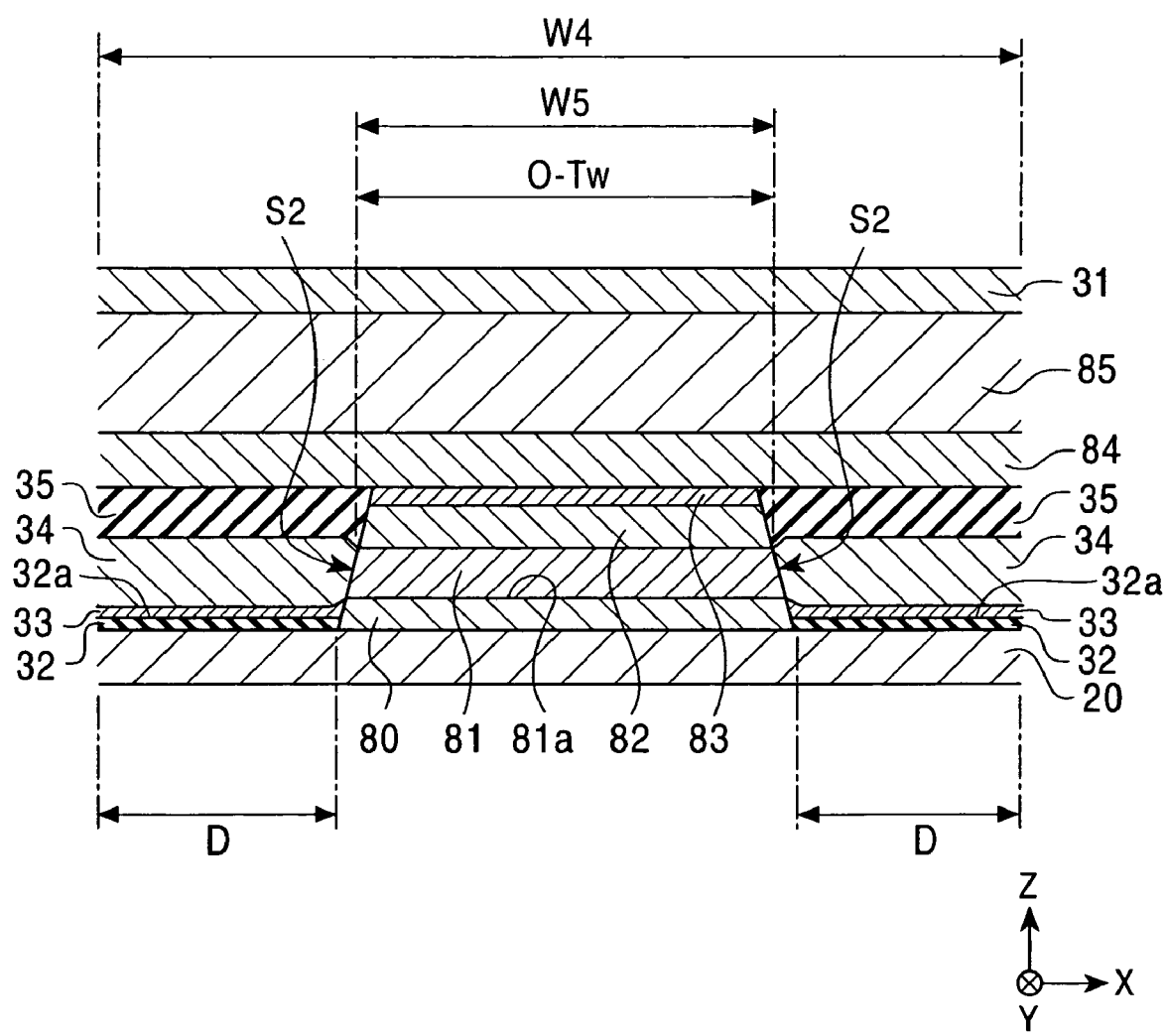
FIG. 5 is a cross-sectional view of a magnetic sensing element according to a third embodiment of the present invention viewed from the opposing face.

FIG. 5 is a cross-sectional view showing the overall structure of a magnetic sensing element according to a third embodiment of the present invention viewed from the opposing face.

The magnetic sensing element shown in FIG. 5 includes a Ta underlayer 80 formed on the first electrode layer 20, a free magnetic layer 81, a nonmagnetic material layer 82, a current limiting layer 83, a pinned magnetic layer 84, an antiferromagnetic layer 85, and the second electrode layer 31, sequentially stacked on the underlayer 80.

The first electrode layer 20 and the second electrode layer 31 are composed of the same material and have the same thickness as those of the first electrode layer 20 and the second electrode layer 31 shown in FIG. 1.

The underlayer 80 controls the crystal orientation of the free magnetic layer 81 to improve the magnetic characteristics and to reduce the resistivity of the free magnetic layer 81.

In FIG. 5, the free magnetic layer 81 is a single magnetic layer. The free magnetic layer 81 is composed of, for example, a NiFe alloy, a CoFe alloy, elemental Co, a CoNiFe alloy, or the like. Alternatively, the free magnetic layer 81 may have a two-layer structure. In such a case, the free magnetic layer 81 may include a Co sublayer in contact with the nonmagnetic material layer 82. Alternatively, the free magnetic layer 81 may have a synthetic ferrimagnetic structure comprising two magnetic sublayers and a nonmagnetic intermediate sublayer disposed between the two magnetic sublayers.

The nonmagnetic material layer 82 is composed of the same material as that of the upper nonmagnetic material layer 27 shown in FIG. 1. The pinned magnetic layer 84 is a single magnetic layer composed of, for example, elemental Co, a CoFe alloy, a NiFe alloy, a CoFeNi alloy, or the like. Alternatively, the pinned magnetic layer 84 may be a composite film composed of these alloys or may have a synthetic ferrimagnetic structure comprising two magnetic sublayers and a nonmagnetic intermediate sublayer disposed between the two magnetic sublayers.

The thickness and the material of the antiferromagnetic layer 85 are the same as those of the upper antiferromagnetic layer 30 shown in FIG. 1. The magnetization direction of the pinned magnetic layer 84 is pinned in the Y direction (height direction) in the drawing by an exchange coupling magnetic field between the antiferromagnetic layer 85 and the pinned magnetic layer 84.

The insulating layers 32 are formed on the first electrode layer 20 at the two side regions D in the track width direction.

The upper faces 32a of the insulating layers 32 are preferably positioned lower than a lower face 81a of the free magnetic layer 81.

The bias underlayers 33 are formed on the insulating layers 32. the hard bias layers 34 are formed on the bias underlayer 33. The hard bias layers 34 are placed against the two side faces of the free magnetic layer 26. The hard bias layers 34 are magnetized in the track width direction (the X direction in the drawing). The magnetization direction of the free magnetic layer 81 is oriented in the X direction by longitudinal bias magnetic fields from the hard bias layers 34. the insulating layers 35 are formed on the hard bias layers 34.

The materials of the insulating layers 32, the bias underlayers 33, the hard bias layers 34, and the insulating layers 35 are the same as in the first embodiment shown in FIG. 1.

The magnetic sensing element shown in FIG. 5 is a top-spin spin-valve magnetoresistive element of a CPP type in which a sensing current flows in a direction perpendicular to the surface of each layer of the magnetic sensing element.

A detection current (sensing current) is fed to the pinned magnetic layer 84, the nonmagnetic material layer 82, and the free magnetic layer 81, and a leakage magnetic field from a recording medium, such as a hard disk, traveling in the Z direction is applied in the Y direction. The magnetization direction of the free magnetic layer 81 then changes from the X direction in the drawing to the Y direction in the drawing. Such a change in the magnetization direction in the free magnetic layer 81 relative to the pinned magnetization direction of the pinned magnetic layer 84 causes the electric resistance to change. The change in electric resistance causes change in voltage or current, and the leakage magnetic field from the recording medium is detected based on the voltage change or current change.

In the magnetic sensing element shown in FIG. 5, the side faces of the underlayer 80, the free magnetic layer 81, the nonmagnetic material layer 82, and the current limiting layer 83 are flush with each other, thereby forming sloped side faces S2.

The length of the pinned magnetic layer 84 and the antiferromagnetic layer 85 in the track width direction is larger than the length W5 of the free magnetic layer 81 in the track width direction.

In making the magnetic sensing element shown in FIG. 5, there is no need to remove the two side portions of the pinned magnetic layer 84 and the antiferromagnetic layer 85 to align with the free magnetic layer 81.

Accordingly, redeposition of the materials of the pinned magnetic layer 84 and the antiferromagnetic layer 85 on the side faces of the free magnetic layer 81 can be prevented. The short-circuiting between the free magnetic layer 81 and the pinned magnetic layer 84 can be decreased or eliminated. As a result, the sensitivity to magnetic field can be enhanced, and the quality can be improved.

Furthermore, the distance between the free magnetic layer 81 and each hard bias layer 34 can be properly controlled. Longitudinal bias magnetic fields of proper magnitudes can be stably supplied to the free magnetic layer 81.

The optical track width O-Tw defined by the length W5 of the free magnetic layer 81 in the track width direction can be accurately controlled, and compatibility to narrower tracks can be enhanced.

Since the length W4 of the pinned magnetic layer 84 in the track width direction is large, the demagnetizing fields in the track width direction are decreased. Thus, the magnetization direction of the pinned magnetic layer 84 can be easily pinned in a direction perpendicular to the track width direction, i.e., the height direction.

Because the current limiting layer 83 is formed between the nonmagnetic material layer 82 and the pinned magnetic layer 84, the effective element area can be reduced even when the optical element area of the free magnetic layer 81 in a direction parallel to the surface of the layer is large. Thus, a CPP magnetic sensing element with high read output can be easily fabricated.

The structure of the current limiting layer 83 is the same as that of the current limiting layer 28 of the second and third embodiments shown in FIGS. 2 and 3.

In this embodiment also, the optical track width O-Tw is 0.15 to 0.3 μm, the length MRh in the height direction is 0.15 to 0.3 μm, and the optical element area is 0.02 to 0.09 μm$^2$, which is large. The effective element area can be reduced to 0.01 μm$^2$ or less. Because the optical element area is large, an external magnetic field from a recording medium can be effectively detected at the magnetic sensing element, and a CPP magnetic sensing element with high sensitivity and superior read characteristics can be fabricated.

Fourth Embodiment

Figure 6:
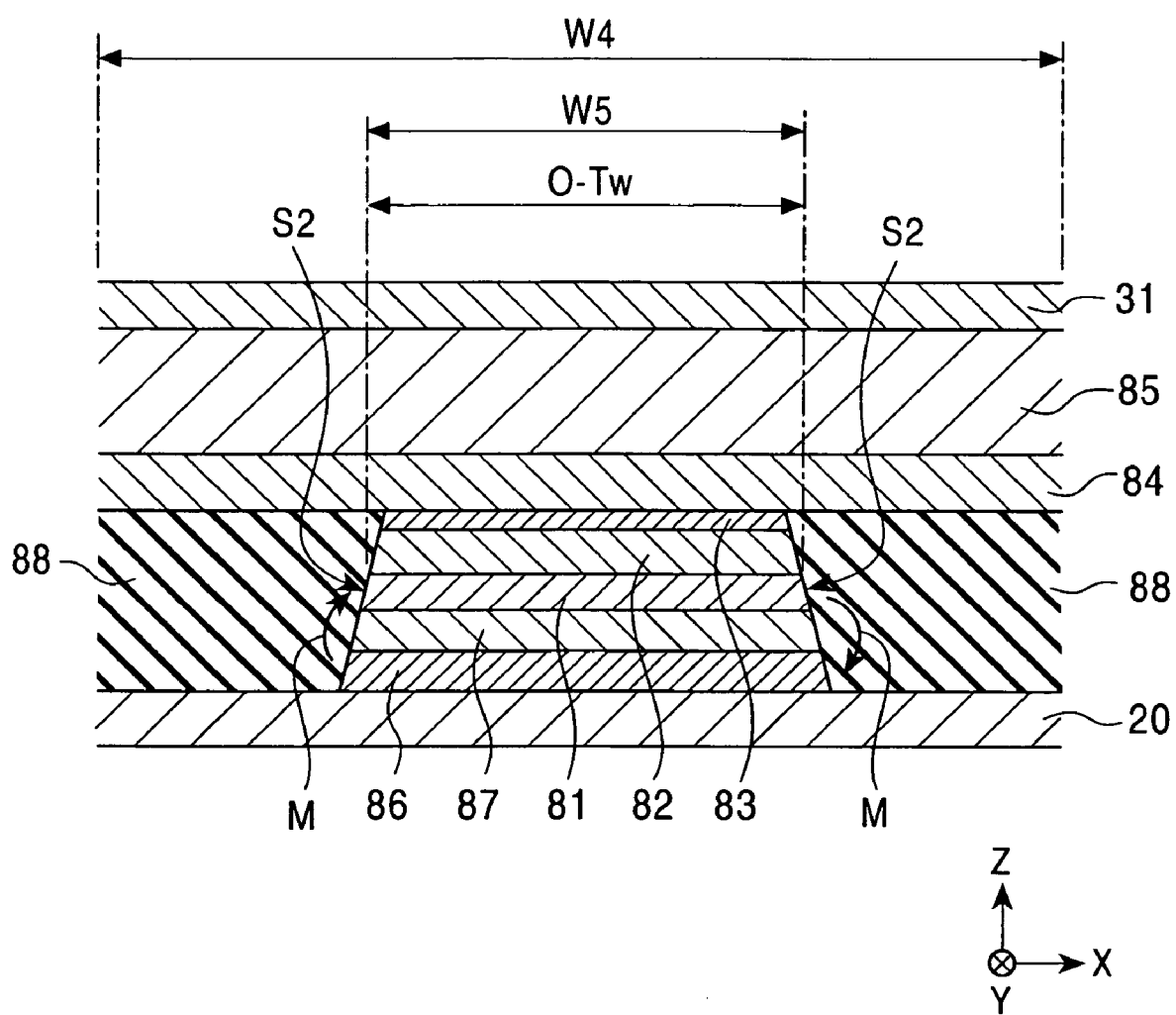
FIG. 6 is a cross-sectional view of a magnetic sensing element according to a fourth embodiment of the present invention viewed from the opposing face.

FIG. 6 is a cross-sectional view of a magnetic sensing element according to a fourth embodiment of the present invention viewed from the opposing face.

The magnetic sensing element shown in FIG. 6 is similar to the magnetic sensing element shown in FIG. 5. However, they differ in way of applying longitudinal bias for orienting the magnetization direction of the free magnetic layer 81 in the track width direction (the X direction).

In the magnetic sensing element shown in FIG. 6, no hard bias layers are formed at the two sides of the free magnetic layer 81. Instead, an in-stack biasing layer 86 is disposed under an interlayer 87 disposed at the bottom of the free magnetic layer 81. The in-stack biasing layer 86 is formed on the first electrode layer 20 and is composed of a hard magnetic material. The in-stack biasing layer 86 is magnetized in a direction antiparallel to the X direction in the drawing. A chromium underlayer may be provided between the in-stack biasing layer 86 and the first electrode layer 20.

In this embodiment, longitudinal bias magnetic fields are provided from the two side ends of the in-stack biasing layer 86 to the free magnetic layer 81, as shown by arrows M in FIG. 6, to magnetize the free magnetic layer 81 in the X direction in the drawing.

The interlayer 87 is preferably composed of a nonmagnetic conductive material. In particular the interlayer 87 is preferably composed of at least one element selected from Ru, Rh, Ir, Cr, Re, and Cu.

In FIG. 6, the interlayer 87 may be composed of an insulating material such as $Al_2O_3$ or $SiO_2$. In such a case, it is necessary to reduce the thickness of the interlayer 87 so as not to block the sensing current flowing between the first electrode layer 20 and the second electrode layer 31 at the interlayer 87. The thickness of the interlayer 87 is preferably 20 to 100 Å.

The in-stack biasing layer 86 disposed under the free magnetic layer 81 with the interlayer 87 therebetween does not pin the magnetization direction of the free magnetic layer 81 as firmly as when the hard bias layers are provided at the two sides of the free magnetic layer 81. Thus, the magnetic domain of the free magnetic layer 81 can be properly controlled, and the magnetization direction of the free magnetic layer 81 responds to the external magnetic field with high sensitivity.

In this embodiment shown in FIG. 6, only insulating layers 88 composed of alumina or $SiO_2$ are formed at the two sides of the side faces S2 of the layers from the in-stack biasing layer 86 to the current limiting layer 83. Accordingly, the shunt loss of the sensing current flowing between the first electrode layer 20 and the second electrode layer 31 can be decreased.

In the magnetic sensing element shown in FIG. 6, the length W4 of the pinned magnetic layer 84 and the antiferromagnetic layer 85 is larger than the length W5 of the free magnetic layer 81. Moreover, the current limiting layer 83 is provided between the nonmagnetic material layer 82 and the pinned magnetic layer 84. Thus, the same advantages as those of the magnetic sensing element shown in FIG. 5 can be achieved.

Fifth Embodiment

Figure 7:
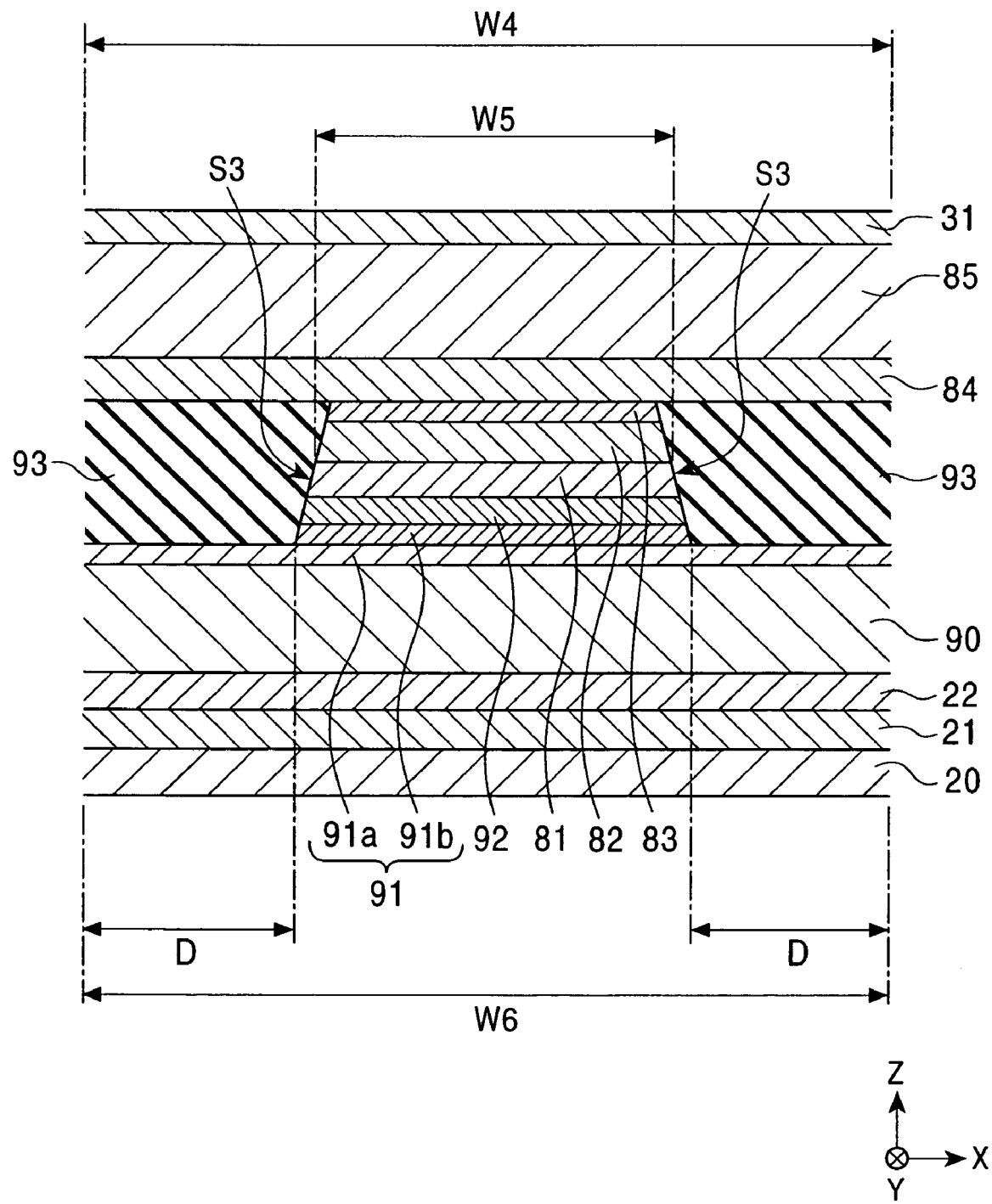
FIG. 7 is a cross-sectional view of a magnetic sensing element according to a fifth embodiment of the present invention viewed from the opposing face.

FIG. 7 is a cross-sectional view of a magnetic sensing element according to a fifth embodiment of the present invention viewed from the opposing face.

The magnetic sensing element shown in FIG. 7 is similar to the magnetic sensing element shown in FIG. 5 except for the method of applying longitudinal bias for orienting the magnetization direction of the free magnetic layer 81 in the track width direction (the X direction in the drawing).

In the magnetic sensing element shown in FIG. 7, the first electrode layer 20, the underlayer 21, and the seed layer 22 are sequentially stacked in that order. A bias antiferromagnetic layer (second antiferromagnetic layer) 90, a ferromagnetic layer 91, a nonmagnetic layer 92, the free magnetic layer 81, the nonmagnetic material layer 82, the current limiting layer 83, the pinned magnetic layer 84, the antiferromagnetic layer 85, and the second electrode layer 31 are sequentially stacked on the seed layer 22 in that order. The layers common to the magnetic sensing elements of FIGS. 5 and 7 are represented by the same reference numerals.

The thickness of the bias antiferromagnetic layer 90 is 80 to 300 Å.

The ferromagnetic layer 91 have a two-layer structure constituted from a first ferromagnetic sublayer 91a and a second ferromagnetic sublayer 91b. In this embodiment, the thickness of the first ferromagnetic sublayer 91a is 8 Å, and the thickness of the second ferromagnetic sublayer 91b is 6 Å.

The nonmagnetic layer 92 is composed of at least one element selected from the group consisting of Ru, Rh, Ir, Cr, Re, and Cu. In this embodiment, the thickness of the nonmagnetic layer 92 is 8 Å.

Referring again to FIG. 7, the second ferromagnetic sublayer 91b of the ferromagnetic layer 91 is in contact with the nonmagnetic layer 92 and is composed of NiFe (permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt.

The first ferromagnetic sublayer 91a is in contact with the bias antiferromagnetic layer 90 and is composed of a ferromagnetic material containing cobalt. The ferromagnetic material containing cobalt increases the magnitude of the exchange coupling magnetic field generated between the bias antiferromagnetic layer 90 and the ferromagnetic layer 91. The ferromagnetic material containing cobalt is preferably one of CoFe and CoFeCr.

Alternatively, the ferromagnetic layer 91 includes a magnetic region composed of NiFe or NiFeX in contact with the nonmagnetic layer 92, and a magnetic region composed of Co-containing ferromagnetic material in contact with the bias antiferromagnetic layer 90.

Alternatively, the ferromagnetic layer 91 may be a single layer composed of NiFe (permalloy) having a thickness of more than 0 nm but no more than 3 nm.

Alternatively, the ferromagnetic layer 91 may be a single layer composed of CoFeCr or a CoFe.

In the magnetic sensing element shown in FIG. 7, the magnetization direction of the ferromagnetic layer 91 is oriented in a direction orthogonal to the magnetization direction of the pinned magnetic layer 84 by an exchange coupling magnetic field between the ferromagnetic layer 91 and the bias antiferromagnetic layer 90.

Since the free magnetic layer 81 is disposed on the ferromagnetic layer 91 with the nonmagnetic layer 92 therebetween, the free magnetic layer 81 is put to a single-magnetic-domain state by an interlayer coupling magnetic field, i.e., the RKKY interaction in this case, generated by the free magnetic layer 81 and the ferromagnetic layer 91 sandwiching the nonmagnetic layer 92. The magnetization direction of the free magnetic layer 81 is oriented in a direction orthogonal to the magnetization direction of the pinned magnetic layer 84.

Such an arrangement prevents the disturbance of the magnetic domain structure of the free magnetic layer 81 resulting from the disturbance of the longitudinal bias magnetic fields applied to the free magnetic layer 81 due to an external magnetic field such as a leakage magnetic field from a recording medium.

Alternatively, the ferromagnetic layer 91 may be constituted from a plurality of ferromagnetic material sublayers having different magnetic moments per unit area and at least one nonmagnetic intermediate sublayer therebetween. In this structure, the ferromagnetic material sublayers adjacent to each other with the nonmagnetic intermediate sublayer therebetween enter a ferrimagnetic state in which the magnetization directions of the ferromagnetic material sublayers are antiparallel to each other. This structure firmly pins the magnetization direction of the ferromagnetic layer 91 in a predetermined direction.

Preferably, the nonmagnetic layer 92 is composed of Ru. When the free magnetic layer 81 and the ferromagnetic layer 91 form a synthetic ferrimagnetic structure in which the magnetization directions of the two layers are antiparallel to each other, the thickness of the nonmagnetic layer 92 is preferably 8 to 11 Å or 15 to 21 Å.

In the present invention, the magnitude of the exchange coupling magnetic field between the bias antiferromagnetic layer 90 and the ferromagnetic layer 91 is increased to firmly pin the magnetization direction of the ferromagnetic layer 91 in a direction orthogonal to the magnetization direction of the pinned magnetic layer 84. Meanwhile, the magnitude of the interlayer coupling magnetic field between the free magnetic layer 81 and the ferromagnetic layer 91 is made smaller than that of the exchange coupling magnetic field so that the free magnetic layer 81 can be reliably magnetized and put into a single-magnetic-domain state in a direction orthogonal to the magnetization direction of the pinned magnetic layer 84 and that the magnetization of the free magnetic layer 81 is rotatable in response to a leakage magnetic field.

In order to increase the magnitude of the exchange coupling magnetic field between the bias antiferromagnetic layer 90 and the ferromagnetic layer 91 and to make the interlayer coupling magnetic field between the free magnetic layer 81 and the ferromagnetic layer 91 smaller than the exchange coupling magnetic field, the per-unit-area magnetic moment of the ferromagnetic layer 91, i.e., Ms×t (product of the saturation magnetic flux density and the layer thickness), is made smaller than that of the free magnetic layer 81.

The magnetic moment per unit area, i.e., Ms×t (product of the saturation magnetic flux density and the layer thickness) of the ferromagnetic layer 91 is the sum of the magnetic moment per unit area (Ms×t) of the first ferromagnetic sublayer 91a and that of the second ferromagnetic sublayer 91b.

In particular, the ratio of the magnetic moment of the free magnetic layer 81 per unit area (Ms×t) to the magnetic moment of the ferromagnetic layer 91 per unit area (Ms×t) is controlled in the range of 3 to 20.

Moreover, NiFe (permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, is used in the second ferromagnetic sublayer 91b in contact with the nonmagnetic layer 92 so that the interlayer coupling magnetic field between the free magnetic layer 81 and the ferromagnetic layer 91 is reduced to a proper magnitude.

In order to simultaneously achieve a single-magnetic domain state and rotatable magnetization in the free magnetic layer 81, the free magnetic layer 81 is preferably constituted from a sublayer composed of NiFe (permalloy) or NiFeX in contact with the nonmagnetic layer 92, wherein X is at least one element selected from the group consisting of Al, Si, Ti, V, Cr, Mn, Cu, Zr, Nb, Mo, Ru, Rh, Hf, Ta, W, Ir, and Pt, and a sublayer composed of a cobalt-containing ferromagnetic material such as elemental Co, CoFe, or CoFeNi in contact with the nonmagnetic material layer 82.

When the free magnetic layer 81 is formed to have such a structure, the thickness of the NiFe or NiFeX sublayer is adjusted to 100 Å and the thickness of the cobalt-containing sublayer is adjusted to 20 Å.

The magnetic domain and the magnetization direction of the free magnetic layer 81 of the magnetic sensing element shown in FIG. 7 can be accurately controlled in detail since they are adjusted in two steps, namely, by the magnitude of the exchange coupling magnetic field between the bias antiferromagnetic layer 90 and the ferromagnetic layer 91 and by the interlayer coupling magnetic field between the ferromagnetic layer 91 and the free magnetic layer 81.

Accordingly, the magnetic sensing element can promote further reduction in track width.

In the magnetic sensing element shown in FIG. 7, side faces of part of the ferromagnetic layer 91, the nonmagnetic layer 92, the free magnetic layer 81, the nonmagnetic material layer 82, and the current limiting layer 83 in the track width direction (the X direction) form continuous side faces S3. The side faces S3 are sloped.

The length W6 of the bias antiferromagnetic layer 90 in the track width direction and the length W4 of the pinned magnetic layer 84 and the antiferromagnetic layer 85 in the track width direction are larger than the length W5 of the free magnetic layer 81. Moreover, the current limiting layer 83 is provided between the nonmagnetic material layer 82 and the pinned magnetic layer 84. Accordingly, the same advantages as those of the magnetic sensing element shown in FIG. 5 can be achieved.

Sixth Embodiment

Figure 8:
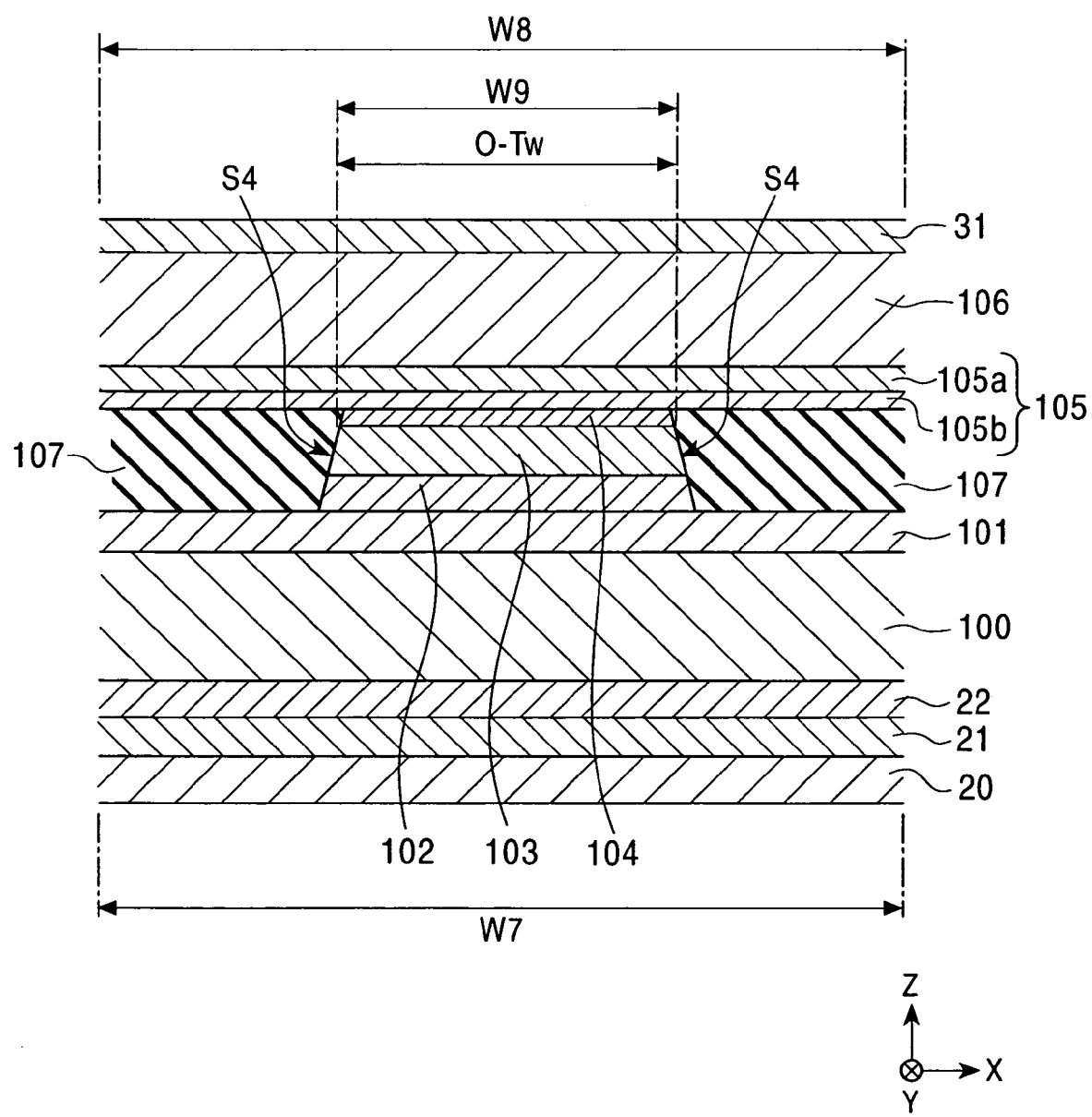
FIG. 8 is a cross-sectional view of a magnetic sensing element according to a sixth embodiment of the present invention viewed from the opposing face.

FIG. 8 is a cross-sectional view of a magnetic sensing element according to a sixth embodiment of the present invention viewed from the opposing face.

Referring to FIG. 8, the magnetic sensing element includes, in order from the bottom, the first electrode layer 20, the underlayer 21, the seed layer 22, a first antiferromagnetic layer 100, a pinned magnetic layer 101, a nonmagnetic material layer 102, a free magnetic layer 103, a nonmagnetic layer 104, a first ferromagnetic sublayer 105a, a second ferromagnetic sublayer 105b, a second antiferromagnetic layer 106, and the second electrode layer 31. The first ferromagnetic sublayer 105a and the second ferromagnetic sublayer 105b constitute a ferromagnetic layer 105.

The arrangement of the layers from the first antiferromagnetic layer 100 to the second antiferromagnetic layer 106 of the magnetic sensing element shown in FIG. 8 is an inverse of that shown in FIG. 7. Moreover, no current limiting layer is provided to the magnetic sensing element shown in FIG. 8.

In FIG. 8, the side faces of the nonmagnetic material layer 102, the free magnetic layer 103, and the nonmagnetic layer 104 in the track width direction (the X direction in the drawing) form sloped continuous side faces S4. Insulating layers 107 are formed at the two sides of the two side faces S4.

The first electrode layer 20, the underlayer 21, the seed layer 22, and the second electrode layer 31 shown in FIG. 8 are the same as the first electrode layer 20, the underlayer 21, the seed layer 22, and the second electrode layer 31 shown in FIG. 7.

The thickness and the materials of the first antiferromagnetic layer 100, the pinned magnetic layer 101, the nonmagnetic material layer 102, and the free magnetic layer 103 are the same as those of the antiferromagnetic layer 85, the pinned magnetic layer 84, the nonmagnetic material layer 82, and the free magnetic layer 81 shown in FIG. 7, respectively. The magnetization direction of the pinned magnetic layer 101 is oriented in the Y direction by an exchange coupling magnetic field between the pinned magnetic layer 101 and the first antiferromagnetic layer 100.

The nonmagnetic layer 104, the ferromagnetic layer 105, and the second antiferromagnetic layer 106 put the free magnetic layer 103 into a single-magnetic-domain state. The materials and the thickness of the nonmagnetic layer 104, the ferromagnetic layer 105, and the second antiferromagnetic layer 106 are the same as those of the nonmagnetic layer 92, the ferromagnetic layer 91, and the bias antiferromagnetic layer 90, respectively. The functions are also the same.

In particular, the first ferromagnetic sublayer 105a is composed of a cobalt-containing ferromagnetic material. The second ferromagnetic sublayer 105b is composed of NiFe (permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt. Alternatively, the ferromagnetic layer 105 may be a single layer composed of CoFeCr or CoFe.

The nonmagnetic layer 104 is composed of at least one element selected from Ru, Rh, Ir, Cr, Re, and Cu. When the nonmagnetic layer 104 is composed of Ru, the thickness thereof is preferably 8 to 11 Å, or 15 to 21 Å.

Preferably, the free magnetic layer 103 includes a sublayer composed of NiFe (permalloy) or NiFeX in contact with the nonmagnetic layer 104, wherein X is at least one element selected from the group consisting of Al, Si, Ti, V, Cr, Mn, Cu, Zr, Nb, Mo, Ru, Rh, Hf, Ta, W, Ir, and Pt, and a sublayer composed of a cobalt-containing ferromagnetic material such as elemental Co, CoFe, or CoFeNi in contact with the nonmagnetic material layer 102.

In the magnetic sensing element shown in FIG. 8, the magnetization direction of the ferromagnetic layer 105 is oriented in a direction orthogonal to the magnetization direction of the pinned magnetic layer 101 by the exchange coupling magnetic field between the ferromagnetic layer 105 and the second antiferromagnetic layer 106. The free magnetic layer 103 is put to a single-magnetic-domain state by an interlayer coupling magnetic field, i.e., the RKKY interaction in this case, with the ferromagnetic layer 105. The magnetization direction of the free magnetic layer 103 is oriented in a direction orthogonal to the magnetization direction of the pinned magnetic layer 101.

In the magnetic sensing element shown in FIG. 8, the magnitude of the exchange coupling magnetic field between the second antiferromagnetic layer 106 and the ferromagnetic layer 105 is increased to firmly pin the magnetization direction of the ferromagnetic layer 105 in a direction orthogonal to the magnetization direction of the pinned magnetic layer 101. Meanwhile, the magnitude of the interlayer coupling magnetic field between the free magnetic layer 103 and the ferromagnetic layer 105 is made smaller than that of the exchange coupling magnetic field so that the free magnetic layer 103 can be put into a single-magnetic-domain state and can have magnetization rotatable in response with leakage magnetic fields.

In the magnetic sensing element shown in FIG. 8, the disturbance of the magnetic domain structure of the free magnetic layer 103 resulting from the disturbance of the longitudinal bias magnetic fields applied to the free magnetic layer 103 due to an external magnetic field such as a leakage magnetic field from a recording medium can be prevented.

The length W7 of the pinned magnetic layer 101 and the first antiferromagnetic layer 100 in the track width direction and the length W8 of the ferromagnetic layer 105 and the second antiferromagnetic layer 106 in the track width direction are larger than the length W9 of the free magnetic layer 103.

In making the magnetic sensing element having such a structure shown in FIG. 8, removing side portions of the pinned magnetic layer 101, the first antiferromagnetic layer 100, the ferromagnetic layer 105, and the second antiferromagnetic layer 106 to align with the free magnetic layer 103 is not necessary.

Accordingly, redeposition of the materials of the pinned magnetic layer 101, the first antiferromagnetic layer 100, the ferromagnetic layer 105, and the second antiferromagnetic layer 106 on the side faces of the free magnetic layer 103 can be prevented. The short-circuiting between the free magnetic layer 103 and the pinned magnetic layer 101 can be decreased or eliminated. As a result, the sensitivity to magnetic field can be enhanced, and the quality can be improved.

The optical track width O-Tw of the magnetic sensing element determined by the length W9 of the free magnetic layer 103 in the track width direction can be accurately defined, thereby promoting narrower tracks.

The demagnetizing fields in the track width direction can be weakened by increasing the length W7 of the pinned magnetic layer 101 in the track width direction. Thus, the magnetization direction of the pinned magnetic layer 101 can be easily firmly pinned in a direction perpendicular to the track width direction, i.e., in the height direction.

The nonmagnetic layer 104 of the magnetic sensing element shown in FIG. 8 is composed of at least one element selected from Ru, Rh, Ir, Cr, Re, and Cu. Even when the nonmagnetic layer 104 is exposed to air during the fabrication process, the thickness of the oxide layer on the surface is small and low-energy ion milling can be employed to remove the oxide layer. Accordingly, degradation of the magnetic characteristics of the free magnetic layer 103 under the nonmagnetic layer 104 can be prevented.

Each of the magnetic sensing elements shown in FIGS. 5 to 8 is provided with shield layers (not shown) on and under the magnetic sensing element and gap layers (not shown) on the shield layers. The magnetic sensing element, the gap layers, and the shield layers constituted a MR head.

Alternatively, the first electrode layer 20 and the second electrode layer 31 may also function as the gap layers. When the first electrode layer 20 and the second electrode layer 31 are composed of a magnetic material, they may also function as the shield layers.

Furthermore, an inductive write head may be stacked on the MR head. In such a case, the shield layer (upper shield layer) on the magnetic sensing element may also function as a lower core layer of the inductive head.

A method for making the magnetic sensing element shown in FIG. 1 will now be explained.

FIGS. 9 to 12 are partial cross-sectional views of the magnetic sensing element in course of manufacture viewed from the opposing face.

Figure 9:
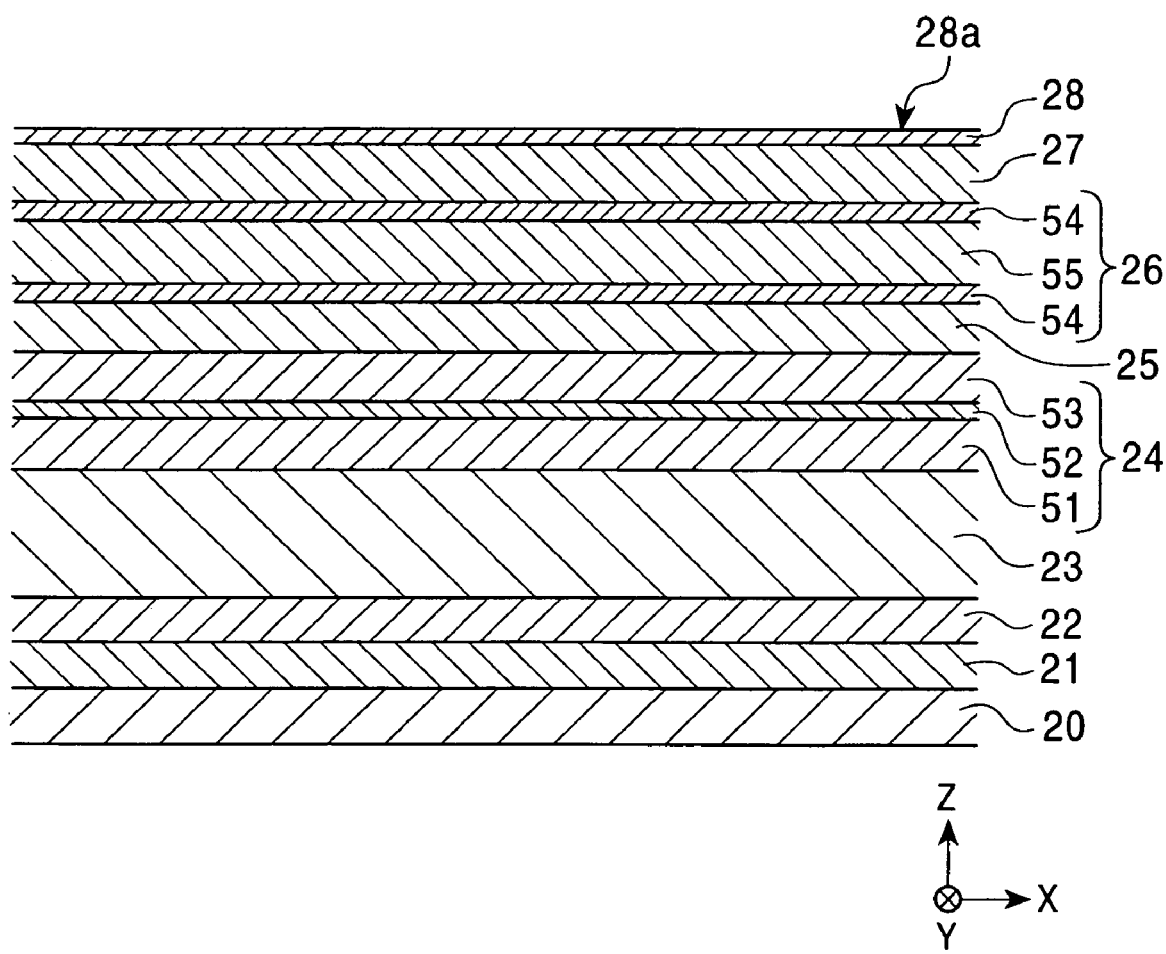
FIG. 9 shows a step of making the magnetic sensing element shown in FIG. 1.

In the step shown in FIG. 9, the following layers are sequentially stacked in that order on the first electrode layer 20: the underlayer 21 composed of Ta or the like; the seed layer 22 composed of NiFeCr or the like; the lower antiferromagnetic layer 23 composed of PtMn or the like; the lower pinned magnetic layer 24 having a three-layer structure including the magnetic sublayers 51 and 53 composed of Co and the intermediate sublayer 52 composed of Ru between the magnetic sublayers 51 and 53; the lower nonmagnetic material layer 25 composed of Cu or the like; the free magnetic layer 26 constituted from the Co sublayers 54 and the magnetic sublayer 55 composed of NiFe; the upper nonmagnetic material layer 27 composed of Cu or the like; and the current limiting layer 28 containing both insulating regions and conductive regions. The current limiting layer 28 protects the surface of the upper nonmagnetic material layer 27. The steps of making the current limiting layer 28 will be explained later in detail.

The thickness of the current limiting layer 28 is 5 to 50 Å. The thickness of the upper nonmagnetic material layer 27 and the lower nonmagnetic material layer 25 is approximately 25 Å. The thickness of the free magnetic layer 26 is 20 to 100 Å. The thickness of the lower antiferromagnetic layer 23 is 80 to 300 Å. The thickness of the lower pinned magnetic layer 24 is 20 to 150 Å.

Figure 10:
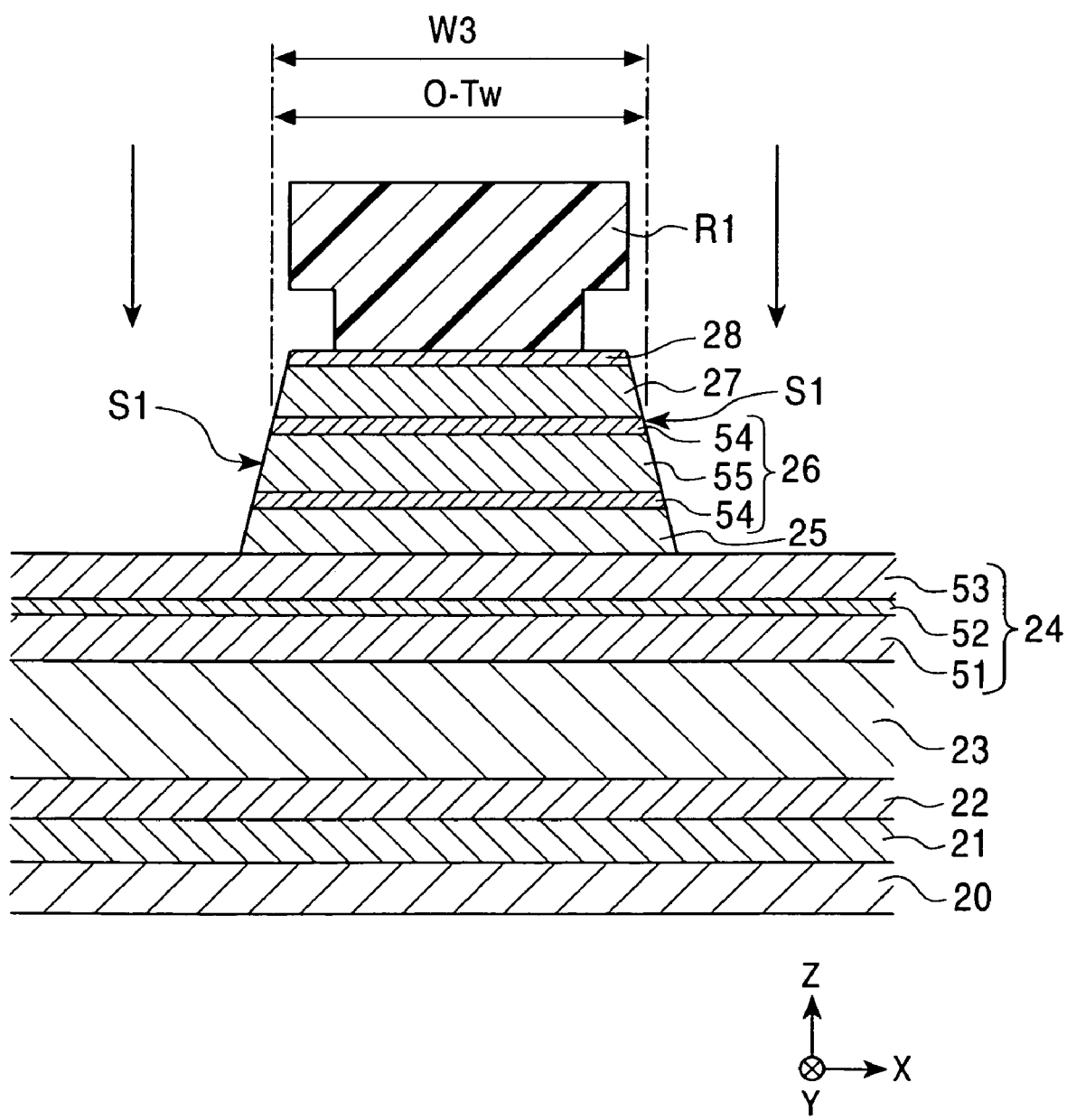
FIG. 10 shows another step of making the magnetic sensing element shown in FIG. 1.

Next, a resist layer is formed on the current limiting layer 28. The resist layer is exposed and developed to form a resist layer R1, the shape of which is illustrated in FIG. 10. For example, the resist layer R1 is a lift-off resist layer with undercuts.

As shown in FIG. 10, the current limiting layer 28, the upper nonmagnetic material layer 27, the free magnetic layer 26 and the lower nonmagnetic material layer 25 are partially milled by ion-milling or reactive ion etching (RIE) in a direction perpendicular to the surface of the current limiting layer 28. Upon completion of the ion milling shown in FIG. 10, the length of the free magnetic layer 26 in the track width direction becomes the optical track width O-Tw. The lengths of the lower pinned magnetic layer 24 and the lower antiferromagnetic layer 23 each become larger than the length W3 of the free magnetic layer 26 in the track width direction.

The continuous side faces S1 constituted from the side faces of the current limiting layer 28, the upper nonmagnetic material layer 27, the free magnetic layer 26, and the lower nonmagnetic material layer 25 are sloped.

Figure 11:
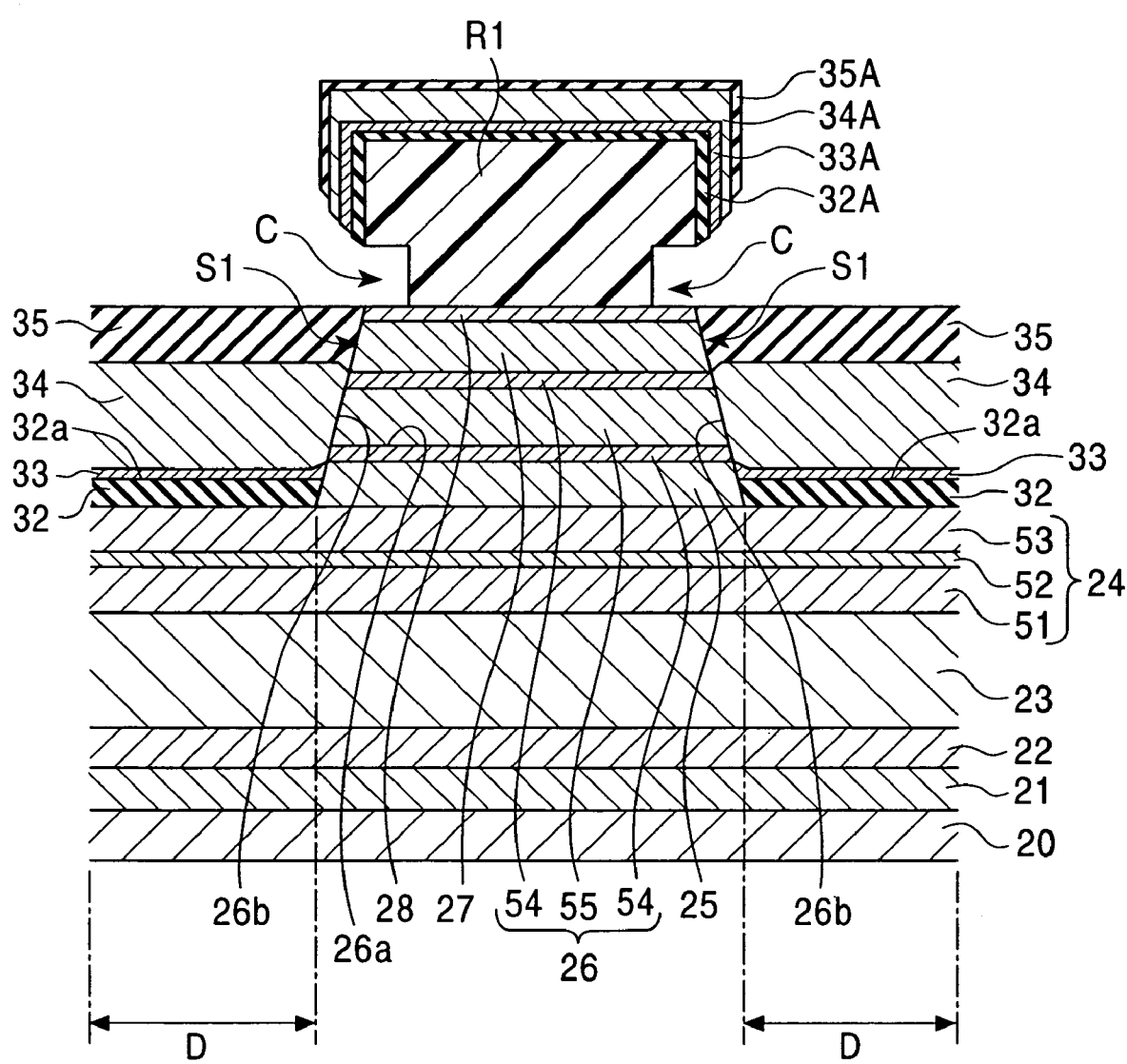
FIG. 11 shows another step of making the magnetic sensing element shown in FIG. 1.

Next, the insulating layers 32, the bias underlayers 33, the hard bias layers 34, and the insulating layers 35 are sputter-deposited on the two side portions D of the lower pinned magnetic layer 24 exposed as a result of the ion milling shown in FIG. 10. During the sputter deposition, the resist layer R1 remains on the current limiting layer 28. As a result, the top face and the side faces of the resist layer R1 are covered with a layer 32A composed of the material of the insulating layers 32, a layer 33A composed of the material of the bias underlayers 33, a layer 34A composed of the material of the hard bias layers 34, and a layer 35A composed of the material of the insulating layers 35, as shown in FIG. 11.

The upper face 32a of each insulating layer 32 is preferably positioned lower than the lower face 26a of the free magnetic layer 26 in the drawing. In other words, the upper face 32a is preferably away from the lower face 26a of the free magnetic layer 26 in a direction opposite to the Z direction in the drawing.

The hard bias layers 34 are placed against the side faces of the free magnetic layer 26. The hard bias layers 34 will be magnetized in the track width direction (the X direction in the drawing) in a later step to supply longitudinal bias magnetic fields for orienting the magnetization direction of the free magnetic layer 26 in the X direction in the drawing.

The bias underlayers 33 are preferably formed only at the bottoms of the hard bias layers 34. Alternatively, part of the bias underlayers 33 may be provided between each side face 26b of the free magnetic layer 26 and each hard bias layer 34. In such a case, the thickness of the part of the bias underlayer 33 between the side face 26b and the hard bias layer 34 in the track width direction (the X direction) is preferably 1 nm or less.

In this manner, the hard bias layers 34 and the free magnetic layer 26 become magnetically continuous. As a result, a problem of buckling resulting from the demagnetizing fields at the ends of the free magnetic layer 26 is prevented. The magnetic domains of the free magnetic layer 26 can be easily controlled.

Figure 12:
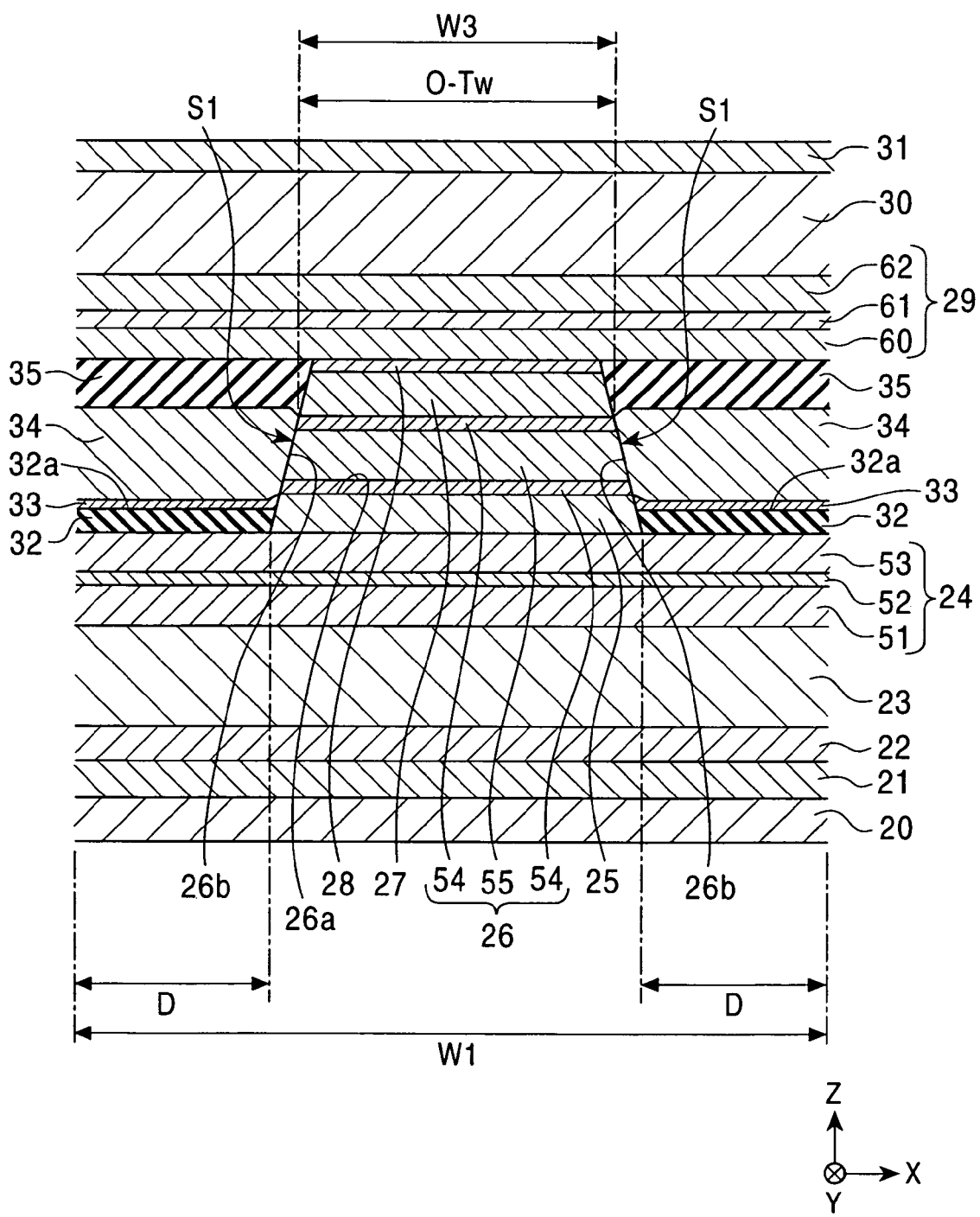
FIG. 12 shows another step of making the magnetic sensing element shown in FIG. 1.

Upon deposition of the insulating layers 35, the resist layer R1 is removed. Referring now to FIG. 12, solid precursor layers of the upper pinned magnetic layer 29 having a three-layer structure comprising the magnetic sublayers 60 and 62 and the intermediate sublayer 61 between the magnetic sublayers 60 and 62, and the upper antiferromagnetic layer 30 are deposited. Subsequently, the size of each of the upper antiferromagnetic layer 30, the upper pinned magnetic layer 29, the lower pinned magnetic layer 24, and the lower antiferromagnetic layer 23 is adjusted. After this step, the length of the upper antiferromagnetic layer 30 and the upper pinned magnetic layer 29 in the track width direction becomes the length W1 in FIG. 1, and the length of the lower antiferromagnetic layer 23 and the lower pinned magnetic layer 24 in the track width direction becomes the length W3 in FIG. 1.

Next, the second electrode layer 31 is deposited. The layers are annealed in a magnetic field in the Y direction to generate exchange coupling magnetic fields between the upper antiferromagnetic layer 30 and the current limiting layer 28 and between the lower antiferromagnetic layer 23 and the lower pinned magnetic layer 24.

The temperature of the annealing is, for example, 270° C. The magnitude of the magnetic field is, for example, 800 kA/m.

The advantages of the above-described method of making the magnetic sensing element according to this embodiment will now be described.

During the ion milling step shown in FIG. 10, the materials of the milled layers sometimes redeposit on the side faces S1 constituted from the side faces of the current limiting layer 28, the upper nonmagnetic material layer 27, the free magnetic layer 26, and the lower nonmagnetic material layer 25.

In a conventional method for making a dual spin-valve magnetic sensing element, the upper pinned magnetic layer 29 approximately 20 to 150 Å in thickness, the upper antiferromagnetic layer 30 approximately 80 to 300 Å in thickness, and a protective layer approximately 20 to 200 Å are first deposited on the top of the upper nonmagnetic material layer 27, and then part of the protective layer, the upper antiferromagnetic layer 30, the upper pinned magnetic layer 29, the current limiting layer 28, the upper nonmagnetic material layer 27, the free magnetic layer 26 and the lower nonmagnetic material layer 25 not covered with the resist layer R1 is removed. Accordingly, the amounts of redeposited materials have been large.

In contrast, according to this embodiment, only the current limiting layer 28, the upper nonmagnetic material layer 27, the free magnetic layer 26, and the lower nonmagnetic material layer 25 are removed. The amounts of the materials redeposited on the side faces S1 are decreased.

In the step shown in FIG. 10, ion milling is stopped before reaching the side portions of the lower pinned magnetic layer 24 and the lower antiferromagnetic layer 23 to decrease the amounts of deposited materials on the side faces S1.

As a result, in this embodiment, the amount of milling, i.e., the depth of the milling in a direction opposite to the Z direction during the step shown in FIG. 10 is approximately 75 to 200 Å.

Since the materials of the lower pinned magnetic layer 24, the lower antiferromagnetic layer 23, the upper pinned magnetic layer 29, and the upper antiferromagnetic layer 30 are prevented from redepositing on the side faces S1, short-circuiting between the free magnetic layer 26 and the upper pinned magnetic layer 29 and between the free magnetic layer 26 and the lower pinned magnetic layer 24 can be reduced or prevented. As a result, the magnetic detection output can be increased, and the quality can be improved.

Since the amounts of the redeposited materials on the charging bias supplier S1 are reduced, the optical track width of the free magnetic layer 26 defined by the length W3 of the free magnetic layer 26 in the track width direction can be accurately controlled, thereby promoting narrower tracks.

Moreover, the distance between the free magnetic layer 26 and each of the hard bias layers 34 can be properly controlled.

Since the lengths W2 and W1 of the upper pinned magnetic layer 29 and the lower pinned magnetic layer 24 are large, the demagnetizing fields in the track width direction become small. As a result, the magnetization directions of the upper pinned magnetic layer 29 and the lower pinned magnetic layer 24 can be easily pinned in a direction perpendicular to the track width direction, i.e., in the height direction.

Since the amount of milling during the ion milling step shown in FIG. 10 is small, the deposition of the milled materials on the side faces of the resist layer R1 and undercuts C of the resist layer R1 is decreased. As a result, high masking accuracy of the resist layer R1 is achieved. When the insulating layers 32, the bias underlayers 33, the hard bias layers 34, and the insulating layers 35 are sputter-deposited in the step show in FIG. 11, the hard bias layers 34 can be accurately formed at a desired position in the Z direction and the track width direction.

In particular, the hard bias layers 34 can be accurately placed against the two side faces of the free magnetic layer 26 in the track width direction, and can stably supply longitudinal bias magnetic fields to the free magnetic layer 26. As a result, the magnetic detection output and asymmetry of the output can be enhanced.

Furthermore, removal of the resist layer R1 is simplified.

In the present invention, prior to depositing the upper pinned magnetic layer 29 and the upper antiferromagnetic layer 30, the lower nonmagnetic material layer 25, the free magnetic layer 26, the upper nonmagnetic material layer 27 is milled with ions so as to determine the length of each layer in the track width direction. In order to protect the layers from the first electrode layer 20 to the upper nonmagnetic material layer 27 from exposure to air, a protective layer is provided to cover the upper nonmagnetic material layer 27.

In this embodiment, the current limiting layer 28 functions as the protective layer.

A method for making the current limiting layer 28 will now be described in detail. FIGS. 13 to 22 are partial schematic diagrams showing the state of the upper face of the upper nonmagnetic material layer 27 during formation of the current limiting layer 28 on the upper nonmagnetic material layer 27.

First, an oxide film of $Al_2O_3$, $SiO_2$, or the like or a nitride film of AlN or the like is sputter-deposited on the upper nonmagnetic material layer 27. In the present invention, the oxide film is preferably composed of an insulating material containing oxide of at least one element selected from the group consisting of Al, Si, Ti, Zr, Hf, Cr, Ta, V, Nb, Mo, W, Fe, Ni, and Co.

The nitride film is preferably composed of an insulating material containing nitride of at least one element selected from the group consisting of Al, Si, Ti, Zr, Hf, Cr, Ta, V, Nb, Mo, W, Fe, Ni, and Co.

Figure 13:
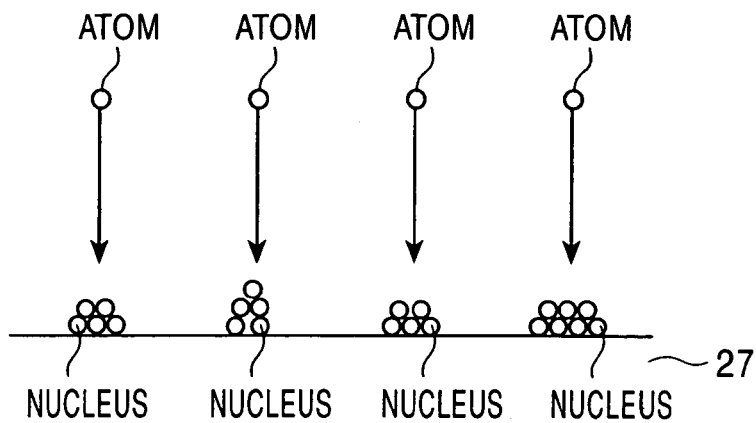
FIG. 13 is a schematic diagram illustrating the state of the upper face of an upper nonmagnetic material layer during forming a current limiting layer on the upper nonmagnetic material layer.

These oxide films and nitride films rarely form continuous films on the upper nonmagnetic material layer 27 when suitable deposition conditions are selected. In other words, these insulating materials help form discontinuous films. This means that particles of the insulating materials readily aggregate on the upper nonmagnetic material layer 27 and form nuclei, as shown in FIG. 13.

In order to enhance aggregation, it is essential to properly adjust the sputtering conditions during sputtering of the insulating material.

The substrate temperature is low, i.e., approximately 20 to 200° C. The distance between the substrate and the target is 200 to 300 mm. The Ar gas pressure is high, i.e., approximately 10 to 50 mTorr (1.3 to 6.7 Pa).

With these sputtering conditions, atoms of the insulating material are prevented from surface migration and aggregate on the upper nonmagnetic material layer 27, thereby forming nuclei.

In this embodiment, the upper nonmagnetic material layer 27 is composed of copper. A copper shin film has a low surface energy and is not easily oxidizable. Thus, as shown in FIG. 13, the nuclei formation rarely takes place in completely wetting mode, and layer-by-layer growth (FM mode) rarely occurs. Accordingly, the oxide film or nitride film formed on the upper nonmagnetic material layer 27 can be readily formed as a discontinuous film.

Figure 14:
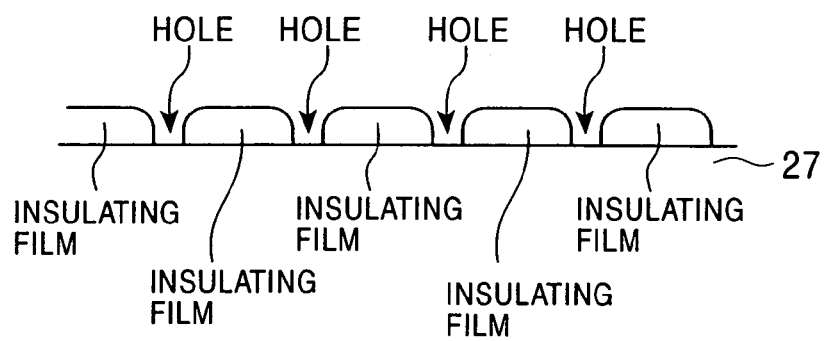
FIG. 14 is a schematic diagram illustrating the state subsequent to the state shown in FIG. 13.

The state of grown nuclei is shown in FIG. 14. The insulating material film formed on the upper nonmagnetic material layer 27 has a plurality of holes penetrating the insulating material film, as shown in the drawing. Alternatively, the insulating material film may have a plurality of grooves, as shown in FIG. 3.

Figure 15:
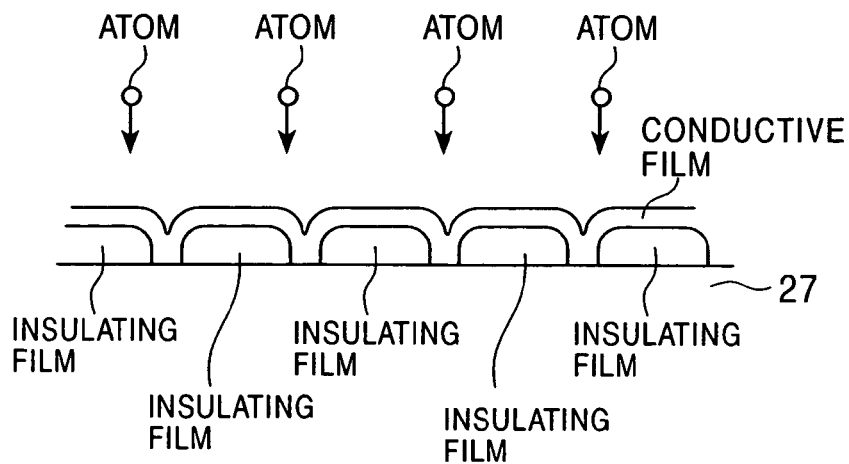
FIG. 15 is a schematic diagram illustrating the state subsequent to the state shown in FIG. 14.

Next, in the step shown in FIG. 15, a conductive material is sputter deposited on the insulating material film and in the holes. As a result, a conductive material layer is formed over the insulating material film and in the holes, thereby filling the holes.

The conductive material is preferably composed of the same material as that of the upper nonmagnetic material layer 27. In this embodiment, the conductive material is copper. Instead, at least one noble metal selected from Ru, Pt, Au, Rh, Ir, Pd, Os, and Re may be used as the conductive material. Since copper and noble metals are not easily oxidizable, oxygen diffusion due to annealing can be prevented. As a result, the contrast between the openings (holes) and the regions other than openings (insulating film) of the current limiting layer can be maintained at a high level.

The conditions for sputtering the conductive material are as follows. The substrate temperature is approximately 20 to 100° C. The distance between the substrate and the target is approximately 40 to 100 mm. The Ar gas pressure is approximately 0.5 to 10 mTorr (0.07 to 1.3 Pa). Thus, the current limiting layer 28 can be made.

Figure 16:
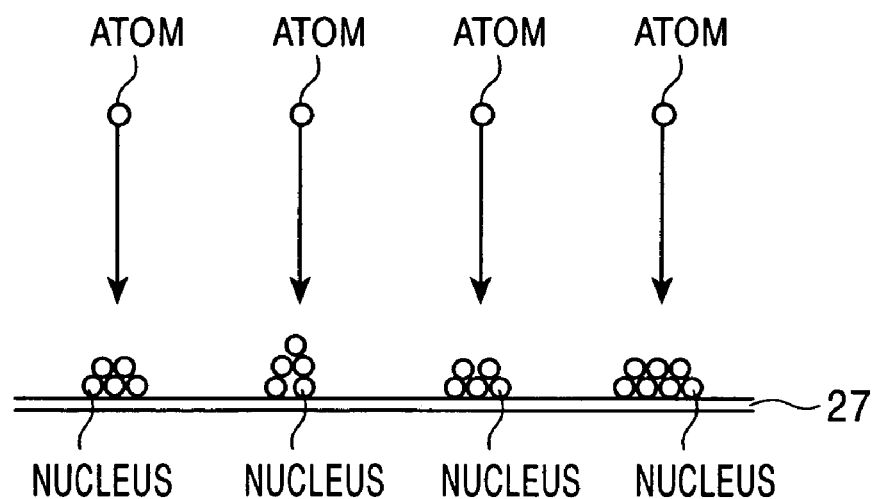
FIG. 16 is a schematic diagram illustrating the state of the upper face of an upper nonmagnetic material layer during forming a current limiting layer on the upper nonmagnetic material layer.

Alternatively, in this invention, the current limiting layer 28 may be made on the upper nonmagnetic material layer 27 by the following steps, as shown in FIG. 16. First, a layer composed of at least one metal element selected from Ag, Cu, Zn, Ge, Pb, Al, Ti, Zr, Hf, Cr, Ta, V, Nb, Mo, W, Fe, Co, Si, Ni, and rare earth elements is sputtered on the upper nonmagnetic material layer 27. The sputtering is stopped after grooves that extend in a direction parallel to the layer surface and penetrate the metal film, or holes penetrating the metal film are formed in the metal film. Atoms of a metal element readily aggregate on the surface of the upper nonmagnetic material layer 27 composed of copper. As shown in FIG. 16, atoms of the metal element aggregate to form islands, for example. As a result, a plurality of holes penetrating the metal film is formed. Instead of holes, grooves that extend in a direction parallel to the film surface may be formed.

In this embodiment, the upper nonmagnetic material layer 27 is composed of copper. Since a thin film composed of copper has a low surface energy and is not easily oxidizable, the nucleus formation shown in FIG. 16 is rarely performed in a completely wetting mode, and layer-by-layer growth (FM mode) rarely occurs. Thus, the atoms of the metal element readily aggregate on the upper nonmagnetic material layer 27.

Figure 17:
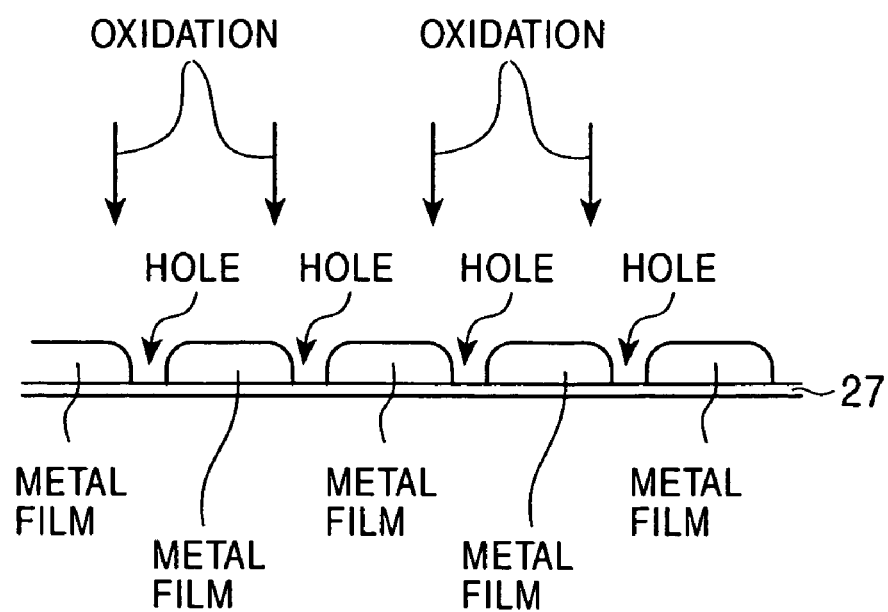
FIG. 17 is a schematic diagram illustrating the state subsequent to the state shown in FIG. 16.
Figure 18:
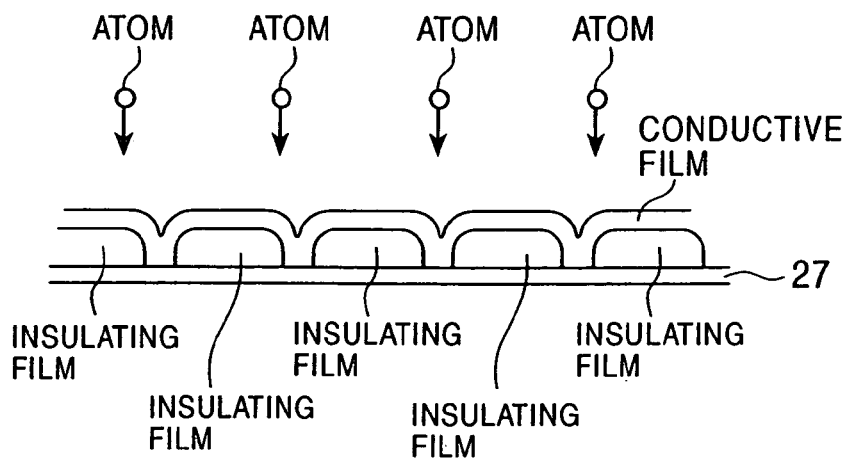
FIG. 18 is a schematic diagram illustrating the state subsequent to the state shown in FIG. 17.

Next, as shown in FIG. 17, the metal film is oxidized. Any one of natural oxidation, plasma oxidation, radical oxidation, and anodic oxidation may be employed.

Upon completion of this oxidation step, the metal film becomes an insulating material film. In the subsequent step shown in FIG. 18, a conductive material is sputter-deposited on the insulating film and in the holes. In this manner, the holes are filled with the conductive material, and a conductive material layer cover the insulating material layer and the holes.

The conductive material layer may be composed of α-Ta, Au, Cr, or W. However, when an element other than noble metal elements or copper is used to form the conductive material layer, the contrast between the openings and regions other than the openings is degraded due to diffusion of the oxygen distribution resulting from migration of oxygen from the insulating material film to the upper pinned magnetic layer 29.

Alternatively, in the present invention, two targets, namely, one target composed of an insulating material and one target composed of a conductive material, may be used during sputtering. In this manner, the current limiting layer 28 containing both particles of the insulating material and particles of conductive material is formed. The insulating material and the conductive material may each be the same as those described above. In the present invention, however, the current limiting layer 28 constituted from an insulating material film with dispersed conductive particles may be prepared using the following materials.

In particular, the current limiting layer 28 may be formed using $Fe_aM_bO_c$, wherein M is at least one element selected from the group consisting of Ti, Zr, Hf, Nb, Ta, Mo, W, and rare earth elements and wherein a, b, and c satisfy the relationships: $40 \leq a \leq 50$, $10 \leq b \leq 30$, $20 \leq c \leq 40$, and $a+b+c=100$, in terms of atomic percent. The current limiting layer 28 here is constituted from an amorphous material containing a compound of M and O and microcrystals mainly composed of iron dispersed in the amorphous material.

Alternatively, the current limiting layer 28 may be formed using $Fe_dM_eN_f$, wherein M is as defined above and wherein d, e, and f satisfy the relationships: $60 \leq d \leq 70$, $10 \leq e \leq 15$, $19 \leq f \leq 25$, and $d+e+f=100$, in terms of atomic percent. The current limiting layer 28 here is constituted from an amorphous material containing a compound of M and N and microcrystals mainly composed of iron dispersed in the amorphous material.

In depositing the FeMo or FeMn alloy, a Fe target and one of a MO target and a MN target are prepared in advance, and sputtering is performed using the two targets to form the current limiting layer 28 having the composition and the structure described above.

In the present invention, the current limiting layer 28 may be made by sputtering Co and at least one of Ru, Pt, Au, Rh, Ir, Pd, Os, Re, Cu, and Ag, and then annealing the sputter-deposited layer to oxidize Co.

Figure 19:
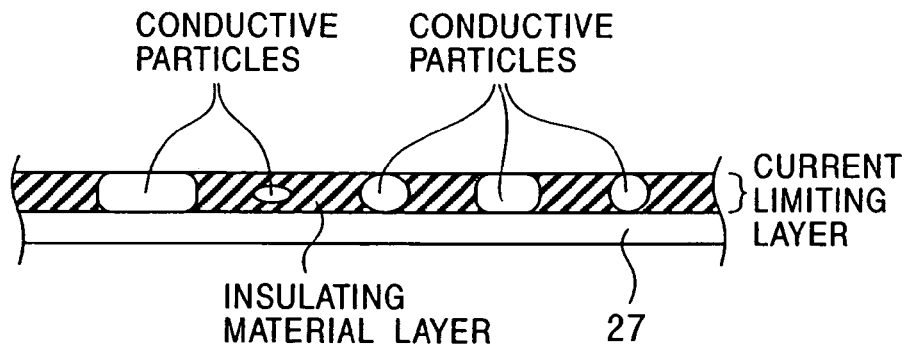
FIG. 19 is a schematic diagram illustrating the state of the upper face of an upper nonmagnetic material layer during forming a current limiting layer on the upper nonmagnetic material layer.

In the step shown in FIG. 19, the current limiting layer 28 composed of FeMo or FeMN is sputter-deposited on the upper nonmagnetic material layer 27 composed of copper. The deposited current limiting layer 28 is annealed to allow phase separation into a granular structure. As a result, the contrast between the oxidized portions and unoxidized portions is enhanced.

Figure 20:
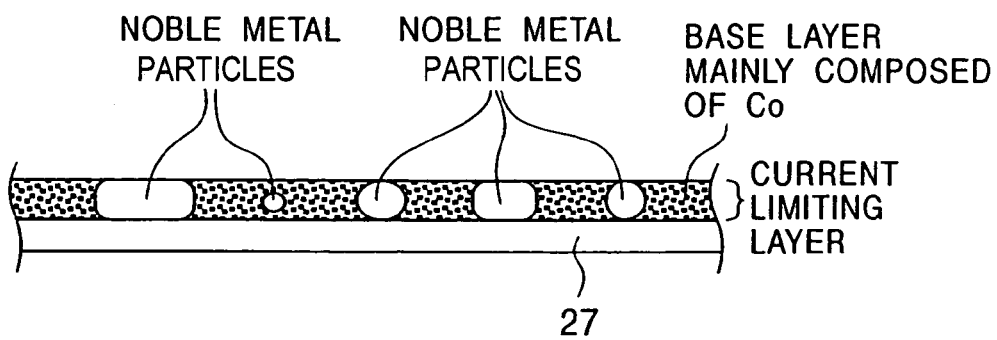
FIG. 20 is a schematic diagram illustrating the state of the upper face of an upper nonmagnetic material layer during forming a current limiting layer on the upper nonmagnetic material layer.
Figure 21:
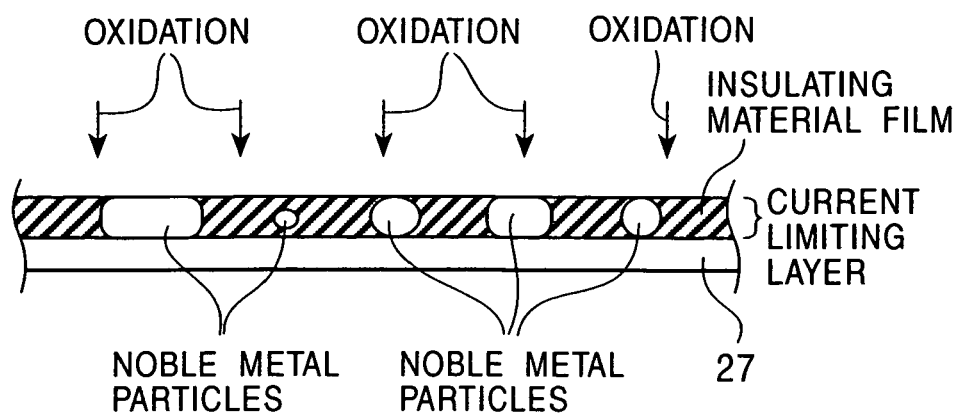
FIG. 21 is a partial schematic diagram illustrating the state subsequent to the state shown in FIG. 20.

In the step shown in FIG. 20, a material containing Co and at least one of Ru, Pt, Au, Rh, Ir, Pd, Os, Re, Cu, and Ag is sputtered on the upper nonmagnetic material layer 27. The sputtered material is annealed to accelerate the phase separation. In the step show in FIG. 21, the regions composed of less-noble material mainly composed of cobalt is oxidized by natural oxidation, plasma oxidation, radical oxidation, or the like. On the other hand, the noble metal particles composed of Au or the like remain unoxidized and thus conductive.

It is essential in both the steps shown in FIGS. 19 and 20 that the grain diameter of the conductive particles contained in the current limiting layer be larger than the thickness of the current limiting layer. Otherwise, the path of a sensing current cannot be properly formed in the current limiting layer, and the path of the sensing current cannot be properly narrowed to increase the output.

Alternatively, in the steps shown in FIGS. 16 to 21, the insulating material layer may be made by nitriding instead of oxidizing.

The current limiting layer prepared as above can function as a protective film when exposed to air.

In making the magnetic sensing element shown in FIG. 4, after the step shown in FIG. 11, the upper sublayer 72 of the upper nonmagnetic material layer 70 is formed using copper on the insulating layers 35 and the current limiting layer 28. Subsequently, the upper pinned magnetic layer 29 and the upper antiferromagnetic layer 30 are deposited.

The upper sublayer 72 composed of copper deposited on the current limiting layer 28 prevents migration of oxygen from the insulating material layer to the upper pinned magnetic layer 29 and the like during the field annealing performed later. As a result, diffusion of oxygen distribution is prevented, and the contrast between the openings and the regions other than the openings can be maintained at a high level.

In making the magnetic sensing element shown in FIG. 5, the solid precursor layers of the underlayer 80, the free magnetic layer 81, the nonmagnetic material layer 82, and the protective current limiting layer 83 are sequentially deposited on the first electrode layer 20, and the steps shown in FIGS. 10 to 12 are then performed.

In making the magnetic sensing element shown in FIG. 6, solid precursor layers of the in-stack biasing layer 86, the interlayer 87, the underlayer 80, the free magnetic layer 81, the nonmagnetic material layer 82, and the current limiting layer 83 also functioning as the protective layer are sequentially deposited on the first electrode layer 20. Subsequently, the steps shown in FIGS. 10 to 12 are performed.

In making the magnetic sensing element shown in FIG. 7, the solid precursor layers of the underlayer 21, the seed layer 22, the bias antiferromagnetic layer 90, the ferromagnetic layer 91, the nonmagnetic layer 92, the free magnetic layer 81, the nonmagnetic material layer 82, and the current limiting layer 83 also functioning as the protective layer are sequentially deposited on the first electrode layer 20. Subsequently, the layers are subjected to first field annealing to generate an exchange coupling magnetic field in the track width direction between the bias antiferromagnetic layer 90 and the ferromagnetic layer 91. The temperature of the first field annealing is, for example, 270° C., and the magnitude of the magnetic field is, for example, 800 kA/m.

Upon completion of first field annealing, the same steps as those shown in FIGS. 10 to 12 are performed to deposit the pinned magnetic layer 84 and the antiferromagnetic layer 85. Second field annealing is then performed.

The direction of the magnetic field during the second field annealing is perpendicular to the track width direction, i.e., the Y direction in the drawing. This direction is the direction of the leakage magnetic field from the recording medium. During the second field annealing, the magnitude of the applied magnetic field is controlled to be smaller than the exchange coupling magnetic field between the bias antiferromagnetic layer 90 and the ferromagnetic layer 91. Moreover, the annealing temperature is adjusted to be lower than the blocking temperature of the bias antiferromagnetic layer 90. In this manner, the exchange anisotropic magnetic field between the antiferromagnetic layer 85 and the pinned magnetic layer 84 can be oriented in the direction of the leakage magnetic field (the Y direction in the drawing) without changing the direction of the exchange coupling magnetic field between the bias antiferromagnetic layer 90 and the ferromagnetic layer 91 oriented in the track width direction. Accordingly, the magnetization direction of the pinned magnetic layer 84 is pinned in a direction orthogonal to the magnetization directions of the ferromagnetic layer 91 and the free magnetic layer 81.

The temperature of the second field annealing is, for example, 250° C. The magnitude of the applied magnetic field is in the range of 8 to 30 kA/m, for example 24 kA/m, which is larger than the coercive force of the pinned magnetic layer 84.

The bias antiferromagnetic layer 90 and the antiferromagnetic layer 85 can be formed using the same antiferromagnetic material by the above-described method of performing field annealing twice.

In making the magnetic sensing element shown in FIG. 8, solid precursor layers of the underlayer 21, the seed layer 22, the first antiferromagnetic layer 100, the pinned magnetic layer 101, the nonmagnetic material layer 102, the free magnetic layer 103, and the nonmagnetic layer 104 are sequentially formed on the first electrode layer 20. The nonmagnetic layer 104 is composed of at least one element selected from the group consisting of Ru, Rh, Ir, Cr, Re, and Cu and functions as a protective layer when exposed to air.

Next, first field annealing is performed to generate an exchange coupling magnetic field between the first antiferromagnetic layer 100 and the nonmagnetic material layer 102. The temperature of the first field annealing is, for example, 270° C. The magnitude of the magnetic field is, for example, 800 kA/m. The material of the nonmagnetic layer 104 diffuses into the free magnetic layer 103 as a result of the first field annealing. The diffusion can be confirmed by secondary ion mass spectrometry (SIMS) analysis or the like.

As in the step shown in FIG. 10, a resist layer is formed on the nonmagnetic layer 104. Subsequently, ion milling or reactive ion etching is performed to regulate the length of the free magnetic layer 103 and the nonmagnetic material layer 102 in the track width direction. The insulating layer 107 is then formed.

Upon completion of deposition of the insulating layer 107, the resist layer is removed, and an oxide layer formed on the surface of the nonmagnetic layer 104 is removed. When the nonmagnetic layer 104 is composed of Ru, the thickness of the nonmagnetic layer 104 is preferably controlled to 8 to 11 Å or 15 to 21 Å during the ion milling process. In this manner, the magnitude of the RKKY interaction between the free magnetic layer 103 and the ferromagnetic layer 105 shown in FIG. 8 can be suitably controlled.

Figure 22:
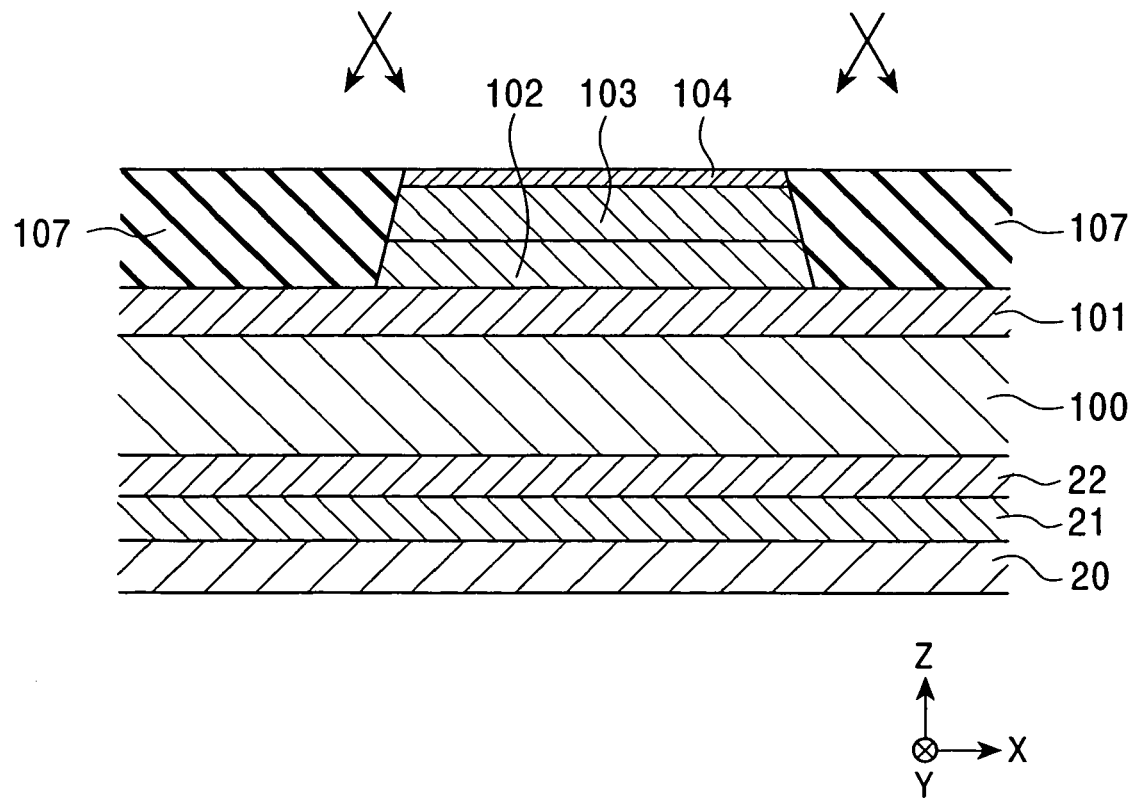
FIG. 22 shows a step of making the magnetic sensing element shown in FIG. 8.

In the ion milling step shown in FIG. 22, low-energy ion milling can be employed to prevent degradation in ferromagnetic characteristics of the free magnetic layer 103. Low-energy ion milling can be employed because the thickness of the nonmagnetic layer 104 is small, i.e., 5 to 20 Å, and the thickness of the oxide layer on the surface of the nonmagnetic layer 104 is small, i.e., 3 to 6 Å.

Here, low-energy ion milling is defined as that using ion beams having beam voltages (acceleration voltages) of less than 1000 V. For example, a beam voltage of 100 to 500 V is used. In this embodiment, a 200 V argon ion beam is used. Use of low-energy ion milling improves the milling accuracy.

The milling time is approximately 20 to 40 seconds. The milling angle is 30 to 70°, and preferably 40 to 60° with respect to the axis perpendicular to the surface of the nonmagnetic layer 104.

In contrast, when Ta, which is the material conventionally used, is used in the nonmagnetic layer 104, the thickness of the nonmagnetic layer 104 must be 30 to 50 Å to protect the layers thereunder from oxidation since Ta is easily oxidizable in air. Moreover, the volume of Ta increases by the oxidation, and the thickness of the nonmagnetic layer 104 increases to approximately 50 Å or more.

In order to remove the thick nonmagnetic layer 104 by ion milling, high-energy ion milling is required. As a result, the ferromagnetic characteristics of the free magnetic layer 103 under the nonmagnetic layer 104 may be degraded.

After the low-energy ion milling, the ferromagnetic layer 105 and the second antiferromagnetic layer 106 are sequentially formed. The layers are then subjected to second field annealing.

The direction of the magnetic field here is the track width direction. During the second field annealing, the applied magnetic field is controlled to be smaller than the exchange coupling magnetic field between the first antiferromagnetic layer 100 and the pinned magnetic layer 101. Moreover, the annealing temperature is controlled to be lower than the blocking temperature of the first antiferromagnetic layer 100. In this manner, the exchange coupling magnetic field between the ferromagnetic layer 105 and the second antiferromagnetic layer 106 can be oriented in the track width direction without changing the direction of the exchange coupling magnetic field between the first antiferromagnetic layer 100 and the pinned magnetic layer 101 oriented in the height direction.

During the second annealing, the annealing temperature is, for example, 250° C. The magnitude of the applied magnetic field is 8 to 30 kA/m, for example, 24 kA/m, which is larger than the coercive force of the free magnetic layer 103.

In the above-described method that performs field annealing twice, the first antiferromagnetic layer 100 and the second antiferromagnetic layer 106 can be composed of the same antiferromagnetic material.

Figure 23:
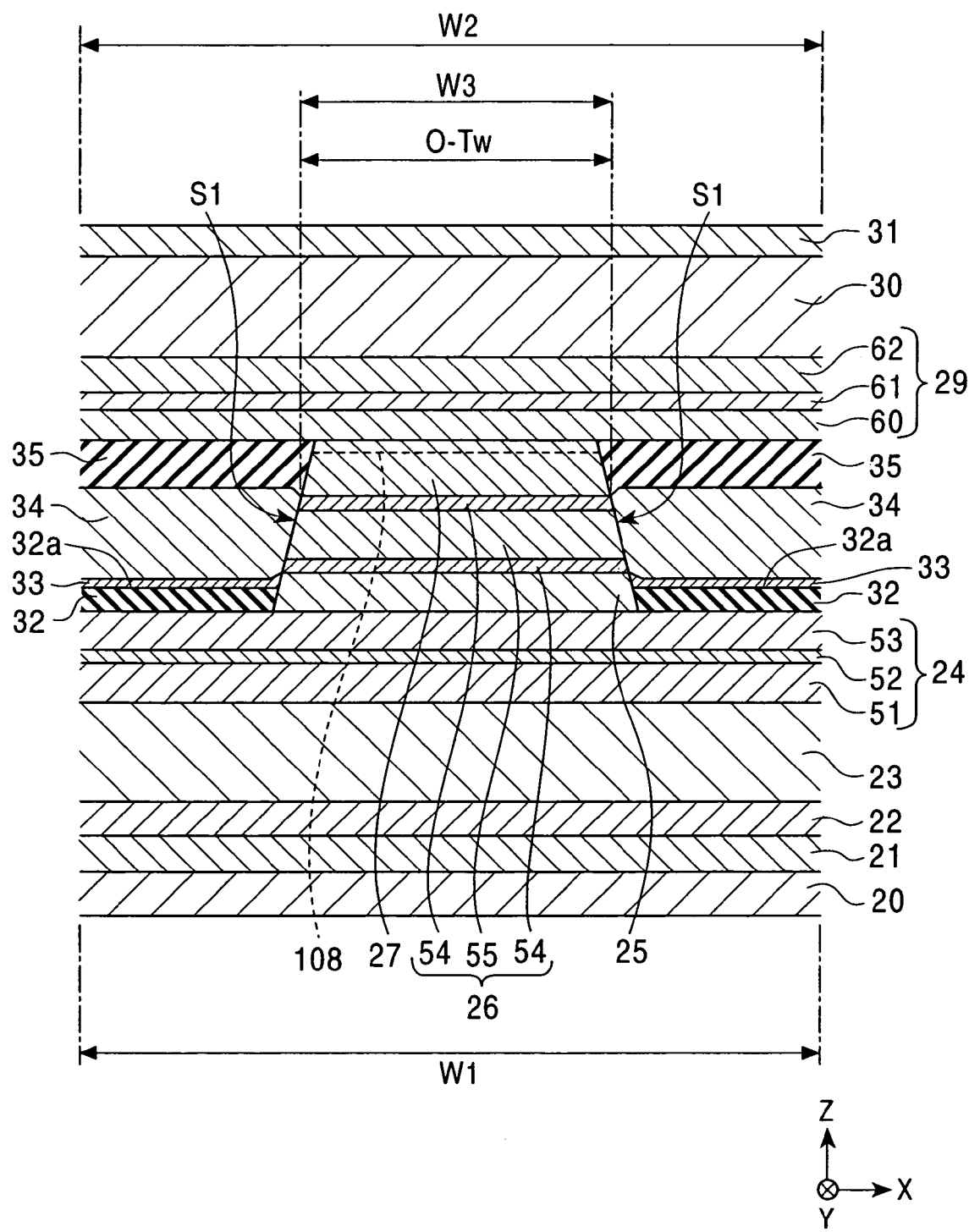
FIG. 23 is a cross-sectional view of a magnetic sensing element according to a seventh embodiment of the present invention viewed from the opposing face.
Figure 24:
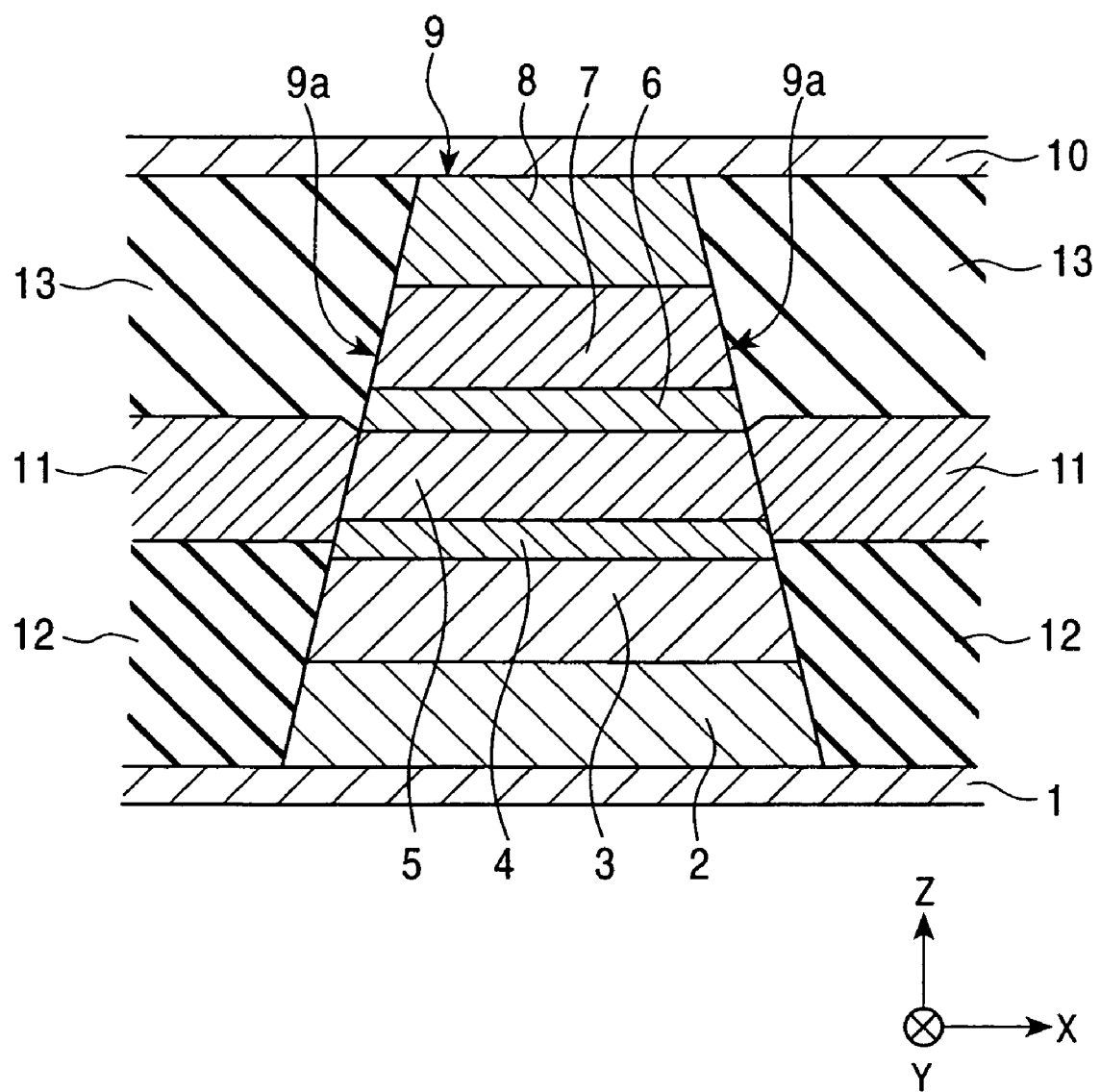
FIG. 24 is a cross-sectional view of a conventional magnetic sensing element viewed from the opposing face.
Figure 25:
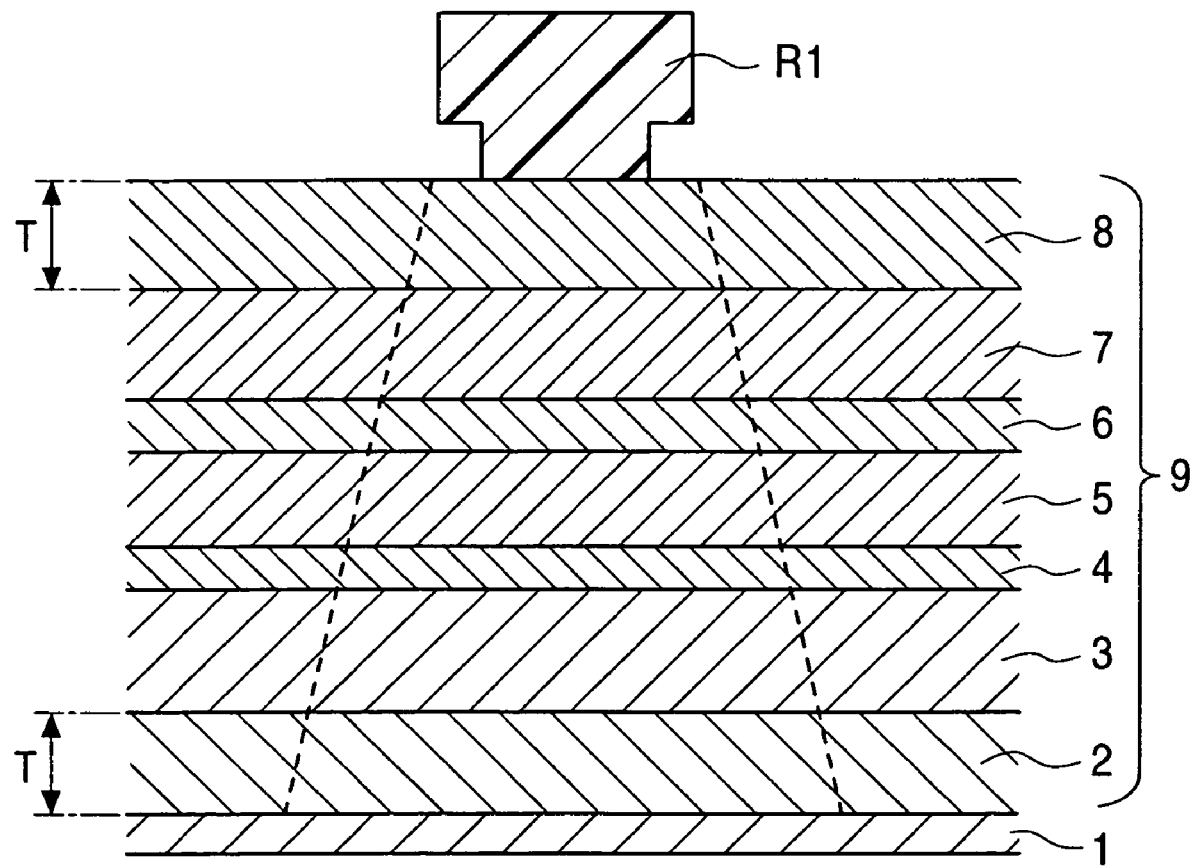
FIG. 25 shows a step of making the conventional magnetic sensing element.
Figure 27:
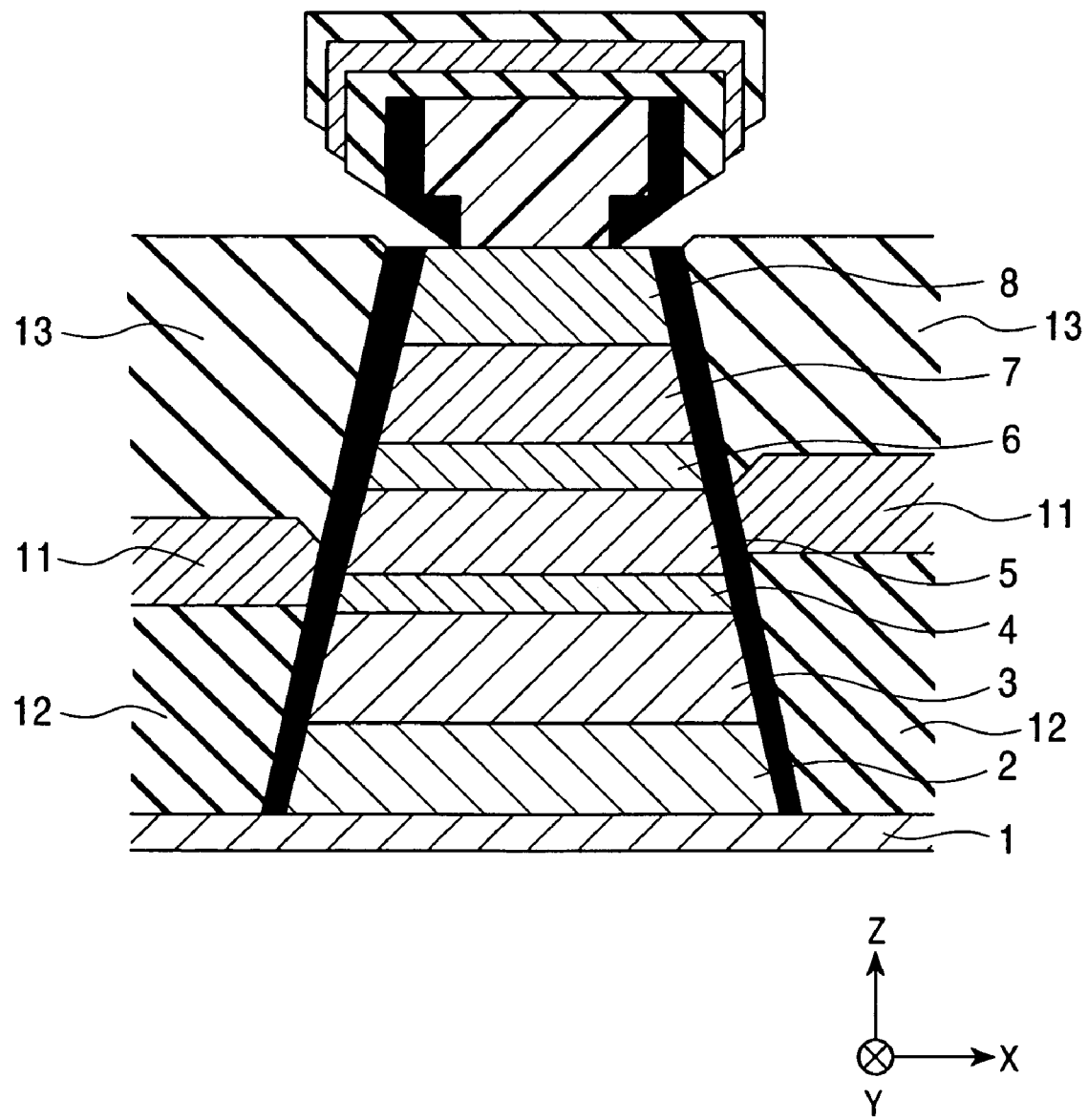
FIG. 27 shows another step of making the conventional magnetic sensing element.

Note that instead of forming the current limiting layer 28 in the step shown in FIG. 9, a protective layer composed of at least one of Ru, Rh, Ir, Cr, Re, and Cu having a thickness of 2 to 10 Å, more preferably 2 to 5 Å, may be formed. In such a case, after removing the resist layer R1 in the step shown in FIG. 11, the protective layer is completely or partly removed by low-energy ion milling, and the upper pinned magnetic layer 29 and the upper antiferromagnetic layer 30 are then formed thereon. A magnetic sensing element fabricated as such is illustrated in FIG. 23 (Seventh Embodiment). In the magnetic sensing element show in FIG. 23, the protective layer is completely removed. However, as shown by a dotted line 108 in the drawing, the protective layer may remain at the interface between the upper nonmagnetic material layer 27 and the upper pinned magnetic layer 29. It should be noted that the material of the protective layer diffuses into the upper nonmagnetic material layer 27. The diffusion can be confirmed using a SIMS analyzer or the like.

In each of the magnetic sensing elements shown in FIGS. 5 to 7, instead of the current limiting layer 83, a protective layer composed of at least one of Ru, Rh, Ir, Cr, Re and Cu may be formed at a thickness of 2 to 10 Å, and more preferably 2 to 5 Å completely or partly milled by ion milling before forming the pinned magnetic layer 84 and the antiferromagnetic layer 85. In this case also, the material of the protective layer diffuse into the nonmagnetic material layer 82. This diffusion can be confirmed with a SIMS analyzer or the like.

According to the above-described present invention, the length of the antiferromagnetic layer in the track width direction is larger than the length of the free magnetic layer in the track width direction. Thus, there is no need to remove the two side portions of the antiferromagnetic layer in the track width direction to align with the free magnetic layer during the fabrication process.

Thus, the amounts of the materials of the composite film redeposited on the two side faces of the free magnetic layer can be reduced. Short-circuiting between the free magnetic layer and the pinned magnetic layer can be completely or partly prevented, and the magnetic field detection output and the quality can be enhanced. Moreover, the track width of the magnetic sensing element can be accurately controlled, thereby making the magnetic sensing element compatible to narrower tracks.

In the present invention, the step of depositing the pinned magnetic layer and the antiferromagnetic layer is separated from the step of making the free magnetic layer and the nonmagnetic material layer.

Accordingly, the current limiting layer containing both insulating regions and conductive regions can be easily formed between the nonmagnetic material layer and the pinned magnetic layer or inside the nonmagnetic material layer.

Thus, a sensing current flowing from the electrode layer to the current limiting layer, the nonmagnetic material layer, and the free magnetic layer flows only locally at the regions disposed against the conductive regions. The effective element area can be miniaturized even when the optical element area of the free magnetic layer in a direction parallel to the film surface is 0.01 μm$^2$ or more. A CPP magnetic sensing element with high read output can be easily fabricated.

Moreover, since the element area of the free magnetic layer is large, i.e., 0.01 μm$^2$ or more, an external magnetic field from a recording medium can be effectively detected. The read output can be increased, and the read waveform becomes more stable.

What is claimed is:

1. A magnetic sensing element comprising, in order from the bottom,
   a first antiferromagnetic layer;
   a pinned magnetic layer;
   a nonmagnetic material layer;
   a free magnetic layer;
   a nonmagnetic layer;
   a ferromagnetic layer; and
   a bias antiferromagnetic layer,
   wherein the free magnetic layer is formed between the nonmagnetic material layer and the nonmagnetic layer, the pinned magnetic layer is formed between the nonmagnetic material layer and the first antiferromagnetic layer, and the ferromagnetic layer is formed between the nonmagnetic layer and the bias antiferromagnetic layer, the magnetization direction of the ferromagnetic layer is oriented in a direction orthogonal to the magnetization direction of the pinned magnetic layer by an exchange coupling magnetic field with the bias antiferromagnetic layer,
   wherein the free magnetic layer is put into a single-magnetic-domain state by an interlayer coupling magnetic field due to a RKKY interaction with the ferromagnetic layer through the nonmagnetic layer, and the magnetization of the free magnetic layer is oriented in a direction orthogonal to the magnetization direction of the pinned magnetic layer,
   wherein a length of the first antiferromagnetic layer and the bias antiferromagnetic layer in a track width direction is larger than a length of the free magnetic layer in the track width direction
   wherein the nonmagnetic layer comprises at least one element selected from the group consisting of Ru, Rh, Ir, Cr, and Re.

2. The magnetic sensing element according to claim 1, wherein the nonmagnetic layer is composed of Ru and has a thickness of 8 to 11 Å or 15 to 21 Å.

3. The magnetic sensing element according to claim 1, wherein a magnetic moment per unit area of the ferromagnetic layer is smaller than that of a magnetic moment per unit area of the free magnetic layer.

4. The magnetic sensing element according to claim 1, wherein the ferromagnetic layer includes a first ferromagnetic sub layer formed on the nonmagnetic layer side and a second ferromagnetic sub layer formed on the bias antiferromagnetic layer side, the first ferromagnetic sub layer comprises a ferromagnetic material containing Co and the second ferromagnetic sub layer includes NiFe layer or a NiFeX layer, wherein X includes at least one of Al, Si, Ti, V, Cr, Mn, Cu, Zr, Nb, Mo, Ru, Rh, Hf, Ta, W, Ir, and Pt.

5. The magnetic sensing element according to claim 1, wherein the free magnetic layer includes a first free magnetic sub layer formed on the nonmagnetic layer side and a second free magnetic sub layer formed on the nonmagnetic conductive layer side, the first free magnetic sub layer includes a NiFe layer or a NiFeX layer, wherein X comprises at least one of Al, Si, Ti, V, Cr, Mn, Cu, Zr, Nb, Mo, Ru, Rh, Hf, Ta, W, Ir, and Pt, and the second free magnetic sub layer comprises a ferromagnetic material that includes Co.

* * * * *